United States Patent
Adar

(10) Patent No.: US 6,501,331 B2
(45) Date of Patent: Dec. 31, 2002

(54) MULTI-BAND AMPLIFIER

(75) Inventor: Aharon Adar, Berkeley Heights, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 09/821,177

(22) Filed: Mar. 29, 2001

(65) Prior Publication Data

US 2001/0011926 A1 Aug. 9, 2001

Related U.S. Application Data

(60) Continuation of application No. 09/080,786, filed on May 18, 1998, now Pat. No. 6,242,986, which is a division of application No. 08/664,972, filed on Jun. 3, 1996, now Pat. No. 5,774,014.

(51) Int. Cl.[7] .............................. H03F 1/14; H03F 3/191
(52) U.S. Cl. ........................... 330/51; 330/126; 330/302
(58) Field of Search .......................... 330/51, 126, 150, 330/302, 310

(56) References Cited

U.S. PATENT DOCUMENTS

| | | | |
|---|---|---|---|
| 3,612,771 A | 10/1971 | Caniquit | 179/15 BP |
| 4,227,156 A | 10/1980 | Mattfeld | 330/126 |
| 4,558,289 A | 12/1985 | Muterspaugh | 330/278 |
| 4,763,082 A | 8/1988 | Reuschle | 330/126 X |
| 4,823,094 A | 4/1989 | Reiffen | 330/263 |
| 4,855,614 A | 8/1989 | Maitre | 307/241 |
| 4,951,060 A | 8/1990 | Cohn | 342/175 |
| 5,032,801 A | 7/1991 | Woo et al. | 330/51 X |
| 5,060,294 A | 10/1991 | Schwent et al. | 455/93 |
| 5,204,645 A | 4/1993 | Hohmann | 334/1 |
| 5,291,516 A | 3/1994 | Dixon et al. | 375/1 |
| 5,361,403 A | 11/1994 | Dent | 455/74 |
| 5,402,138 A | 3/1995 | Hulett et al. | 343/840 |
| 5,406,615 A | 4/1995 | Miller, II et al. | 379/59 |
| 5,438,684 A | 8/1995 | Schwent et al. | 455/89 |
| 5,448,255 A | 9/1995 | Hulett et al. | 343/840 |
| 5,457,734 A | 10/1995 | Eryaman et al. | 379/58 |
| 6,111,459 A * | 8/2000 | Nishijima et al. | 330/51 |
| 6,242,986 B1 * | 6/2001 | Adar | 330/302 |

OTHER PUBLICATIONS

Wirbel et al., "Communications Design," Electronic Engineering Times, May 27, 1996.

* cited by examiner

Primary Examiner—Steven J. Mottola
(74) Attorney, Agent, or Firm—Pennie & Edmonds LLP

(57) ABSTRACT

A GaAs MMIC dual-band amplifier for wireless communications is disclosed for operation at either the 800 MHz or the 1900 MHz band and it provides desired gain and input and output impedance. Switching impedance networks are used at the input and output of the amplifier to provide matching input impedance and desired output impedance for operation in the two bands. Switching impedance networks are also used between any successive stages of the amplifier to provide proper interstage impedance. The dual band amplifier includes a bias control circuit which biases the amplifier to operate in A, B, AB or C mode. The amplifier can be used for the AMPS 800 or the GSM 900 operation or any other cellular operation such as the PCS 1900 and the it can be switched between the two operations by simply applying a proper control signal to the amplifier.

39 Claims, 18 Drawing Sheets

MULTI-BAND AMPLIFIER

This application is a continuation of U.S. application No. 09/080,786 filed on May 18, 1998, now U.S. Pat. No. 6,242,986, which is a division of U.S. application No. 08/664,972 filed on Jun. 3, 1996, now U.S. Pat. No. 5,774,014.

FIELD OF THE INVENTION

The present invention relates to the field of amplifiers and more particularly, power amplifiers for wireless telecommunications.

BACKGROUND OF THE INVENTION

There are currently many different wireless communications systems promulgated by the telecommunications industries and used in the world. These systems are complex and they set forth specifications regarding all aspects of wireless communications, including physical characteristics of signal transmission, such as transmission frequency and operation mode.

One of the earliest wireless communications systems developed in North America is called the advanced mobile phone service ("AMPS"). Used for analog cellular communications, AMPS specifies a mobile station transmission frequency band between 824 MHz and 849 MHz. This band is often referred to as the 800 MHz band or the cellular band. Within the same frequency band also operates a later developed system called the digital mobile phone service ("DMPS"), which is used for both digital and analog communications. These systems are generally referred to in the industry as AMPS 800 and DMPS 800.

A European wireless communications system, the global system for mobile communications ("GSM"), specifies a mobile station transmission frequency band between 890 MHz to 915 MHz and it is used for digital communications. This system is often referred to as GSM 900. Although not widely adopted in North America, GSM 900 is highly popular in Europe and parts of Asia. Recently, a new system called personal communications system ("PCS") 1900, which specifies a mobile station transmission frequency between 1850 MHz and 1910 MHz, is proposed for use in North America. The transmission frequency of PCS 1900 is substantially higher than that of AMPS 800 or GSM 800.

There are many other systems. For example, the nordic mobile telephone 450 system ("NMT-450") specifies a transmission frequency between 463 MHz and 468 MHz and the signal modulation technique of FDMA. The nordic mobile telephone 900 system ("NMY-900") specifies a transmission frequency between 935 MHz and 960 MHz and the same signal modulation technique.

As for digital cordless telephones, there are, for example, cordless telephone 2 ("CT2") requiring a transmission frequency between 864 MHz and 868 MHz and modulation technique of TDMAIFDM, and digital European cordless telephone ("DECT") specifying a transmission frequency between 1886 MHz and 1990 MHz with the same modulation technique.

Those different transmission frequency bands and operating modes present a unique challenge for wireless service providers and particularly for manufactures of wireless communications equipment. If a service provider wishes to replace its currently used wireless system with one operating in a higher frequency band (e.g., from AMPS 800 to PCS 1900), the existing base stations must be upgraded so that they operate in accordance with the new system. By using upconverters which convert a lower frequency signal to a higher frequency signal, the base stations can be upgraded to operate at a higher frequency. Of course the base stations must also be updated to comply with other aspects of the new wireless system.

In addition to upgrading the base stations, individual cellular telephones in the hands of customers must also be upgraded or replaced so that they be compatible with the new wireless system. In particular, since the power amplifier used in each cellular phone is optimized to operate within a particular frequency band and at a particular mode, it needs to be replaced with a new power amplifier suitable for operation under the new wireless standard.

For example, cellular phones used for AMPS 800 contain a power amplifier optimized to operate within the cellular band (i.e., the 800 MHz band). If, however, AMPS 800 is replaced with PCS 1900, the old AMPS phones cannot be used any more; they must be upgraded or replaced. Replacing cellular phones is expensive. A new cellular phone which can be easily upgraded is desired.

For cellular phone manufactures, different wireless systems requires different power amplifiers which increases cost. It is desired that a single amplifier be used for different systems. Different wireless systems present another problem: If a cellular phone user crosses from one area served by one wireless system into an area served by a different wireless system, he will not be able to use his phone. It is desired that the same cellular phone be used under different wireless systems and that the user can simply activate a switch to use it under a different wireless system. Preferably, when a user enters into an area served by a different wireless system, the user's phone is automatically switched to operate under the new wireless system that covers the area. This can be achieved by a base stations sending a signal to the cellular phone to switch the cellular phone. In any event, it requires a power amplifier capable of operating under different wireless systems.

U.S. Pat. No. 5,060,294 assigned to Motorola Inc. describes a dual mode power amplifier operable in either linear or saturation mode. The mode selection is accomplished with the use of a processor by (1) altering the dc bias to a power transistor in the amplifier and/or (2) altering the ac load of the amplifier to change the load line. Although the amplifier may operate in either linear or saturation mode, it is not suitable for operation at different wireless frequencies. For example, the amplifier is not suitable to operate in both the cellular band (the 800 MHz band) and the new PCS band (the 1900 MHz band).

U.S. Pat. No. 5,438,684, also assigned to Motorola Inc., describes a dual-mode RF signal power amplifier comprising two amplifying branches connected in parallel, one for non-linear mode operation such as the FM mode and the other for linear mode operation such as the TDMA digital mode. A PIN diode is connected in series with one of the branch for decoupling it from the other branch. When operating, the selected branch is turned on whereas the non-selected branch is turned off. This dual-mode power amplifier is only suitable for operation at one frequency such as 800 MHz or 1900 MHz, but not at both frequencies.

It is therefore an object of the present invention to provide a multi-band amplifier that can operate under different wireless systems and provide required power and efficiency.

SUMMARY OF THE INVENTION

The present invention provides an amplifying apparatus to operate at different frequencies or different frequency bands (e.g., the cellular band and the PCS band) and in different modes (e.g., A, B, AB or C). The amplifier can be used in cellular phones to operate under different wireless systems.

In one embodiment, the amplifying apparatus comprises a plurality of amplifiers each suitable to operate at one of a plurality of predetermined frequencies, and a control circuit. According to the frequency of input signal, the control circuit, responsive to a control signal, selectively enables the amplifier suitable for operating at the input signal frequency while it prevents the other amplifiers from operation. The control signal may be generated manually with the use of a switch or automatically by a detecting circuit which detects the frequency of the input signal; it may also be provided or triggered by a base station for wireless communications.

In this embodiment, each amplifier comprises at least one amplifying stage for amplifying the input signal. Each amplifier has input impedance means for providing predetermined input impedance and output impedance means for providing predetermined output impedance at the frequency the amplifier is suitable to operate. Preferably, the input impedance approximately matches source impedance of input signal.

In a preferred embodiment, each amplifier comprises a plurality of amplifying stages arranged as a cascade. Predetermined interstage impedance between any two successive amplifying stages is provided by interstage impedance means at the signal frequency the amplifier is suitable to operate. Preferably, each amplifier stage includes at least one amplifying transistor, and the amplifier is enabled or disabled by the control circuit by turning the amplifying transistor(s) in the amplifier on or off. The control circuit also operates to bias the selected amplifier to operate in a desired operating mode. More preferably, the amplifying apparatus comprising the amplifiers and the control circuit is a monolithic GaAs integrated circuit ("GaAs MMIC").

In accordance with another embodiment, an amplifying apparatus is provided with at least one amplifying stage, and input impedance means for providing, in accordance with the frequency of input signal, predetermined input impedance at the frequency of the input signal. Preferably, such input impedance matches source impedance. More preferably, the amplifying apparatus further includes output impedance means for providing predetermined output impedance at the signal frequency. Still more preferably, a bias control circuit is provided for selectively biasing the amplifying stage to operate in one of a plurality of predetermined operating modes.

In a preferred embodiment, the amplifying apparatus includes a plurality of amplifying stages arranged as a cascade. The apparatus is provided with input impedance switching means which selectively provides, in accordance with input signal frequency, one of a plurality of input impedance networks to input of a first amplifying stage. Operating with the first stage, the selected input impedance network provides predetermined input impedance which preferably approximately matches source impedance at the input signal frequency. Interstage impedance means are also provided for providing predetermined interstage impedance. More specifically, the interstage impedance means comprise means for controlling, in accordance with the input signal frequency, the impedance of an impedance network connected between a preceding stage and a dc power supply.

The preferred embodiment is further provided with output impedance switching means which selectively provides, in accordance with input signal frequency, one of a plurality of output impedance networks to output of a last amplifying stage. Operating with the last stage, the selected output impedance network provides predetermined output impedance.

BRIEF DESCRIPTION OF THE DRAWINGS

Those and other objects, features and advantages of the invention will be more apparent from the following detailed description in conjunction with the appended drawings in which.

DETAILED DESCRIPTION OF THE INVENTION

Figure 1A:
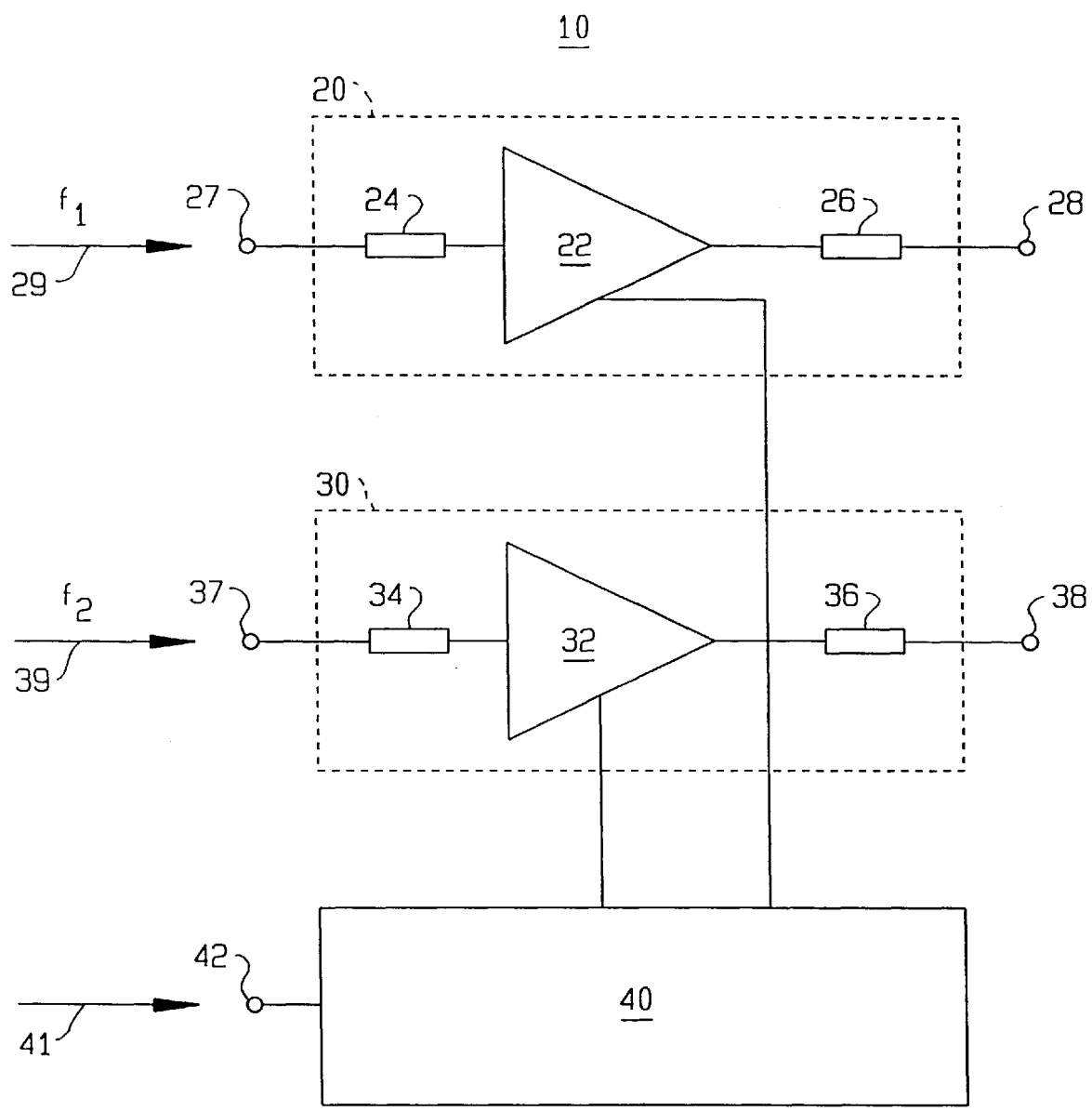
FIG. 1A is the block diagram of a multi-band amplifier of the present invention.

The present invention provides a multi-band amplifier with high power and efficiency for wireless or other applications where a multi-band amplifier is required.

Upon examining existing amplifiers prior to the present invention, the inventor of the present invention found that there are two main obstacles for developing a wide band power amplifier that can operate under different wireless systems over a broad band (such as a band covering the frequency range from 800 MHz to 1900 MHz):

First, changing from one wireless system to another wireless system often changes the transmission frequency, resulting in changes to the input, output and inter-stage impedance of an amplifier. The changes to these impedance, which had been optimized to operate at a prior frequency band, destroys the optimized condition, resulting in reduced gain, power capability and efficiency. Second, different wireless systems often require the amplifiers to operate in different modes (e.g., A, B, AB or C). The operation mode of an amplifier is set by providing a proper bias to the transistors in the amplifier and by providing a proper ac load line. Most of the existing amplifiers can only operate in one mode which is fixed when the amplifier is made.

A conventional amplifier is designed to operate at a particular frequency or within a particular frequency band. At such frequency, the amplifier provides input impedance that matches source impedance, and output impedance of a desired value. For example, the source impedance is typically 50 ohms. The output impedance can be 5 ohms. The factors that are considered in determining the desired output impedance are mainly (1) the frequency at which the amplifier is to operate, (2) the output power that the amplifier is to provide, and (3) the dc bias to the amplifier.

If the amplifier contains more than one amplifying stage, proper interstage impedance between two successive stages is also required. Preferably, the interstage impedance is such that matching impedance between adjacent stages is provided (i.e., the output impedance of a preceding stage matches the input impedance of a following stage), which maximizes the output power level. Moreover, the interstage impedance is such that it provides a suitable interstage load line for a desired mode of operation. For the 800 MHz operation, because the ac gain of an amplifier is more readily obtained, stringent interstage impedance matching is usually not required. The amplifier typically provides sufficient gain as long as the impedance between two successive stages is not overly mismatched. For higher frequency operation such as the 1900 MHz operation, however, more stringent interstage impedance matching is required in order to achieve the required output power level. Preferably, impedance matching is achieved between adjacent stages for high frequency operations.

When an amplifier is put to operate at a substantially different frequency than it is originally designed, the input and output impedance of the amplifier and any interstage impedance changes due to the frequency change. As a result, the amplifier no longer provides matching input impedance. The output impedance of the amplifier also changes. If there was matching interstage impedance at the original frequency, it will no longer exist at the new frequency. The amplifier will generally no longer provide the required ac gain, output power level and efficiency. For example, a conventional 800 MHz power amplifier would not properly operate at 1900 MHz.

The present invention provides an amplifying apparatus which operates at different frequencies and in different modes. Referring to FIG. 1A, in a first embodiment, amplifying apparatus 10 of the present invention comprises a first amplifier 20, a second amplifier 30 and a control circuit 40. Depending on input signal frequency, control circuit 40 selectively enables one of the two amplifiers to operate while prevents the other amplifier to operate.

First amplifier 20 is suitable to operate at a first frequency $f_1$ (e.g., 800 MHz) or in a first frequency band (e.g., the cellular band). It comprises an amplifying stage 22, an input impedance network 24 and an output impedance network 26. Input signal 29 at first frequency $f_1$ is provided to an input terminal 27, and output signal from the amplifier is provided at an output terminal 28. In this amplifier, input impedance matching source impedance is provided at around frequency $f_1$ by input impedance network 24 operating in conjunction with amplifying stage 22. Predetermined output impedance is obtained at around frequency $f_1$ by output impedance network 26 operating in conjunction with amplifying stage 22.

Second amplifier 30 is suitable to operate at around a second frequency $f_2$ (e.g., 1900 MHz) or in a second frequency band (e.g., the PCS band). It comprises an amplifying stage 32, input impedance networks 34 and output impedance network 36. Input signal 39 is received at an input terminal 37. Output signal from amplifier 30 is provided at an output terminal 38. In amplifier 30, input impedance matching source impedance is provided at around frequency $f_2$ by input impedance network 34 operating in conjunction with amplifying stage 33. Predetermined output impedance is obtained at frequency $f_2$ by output impedance network 36 operating in conjunction with amplifying stage 32.

Control circuit is connected to amplifiers 20 and 30. It receives control signal 41 and selectively enables, in accordance with the control signal, the amplifier suitable for operating at the frequency of the input signal while prevents the other amplifier from operation.

Amplifying apparatus 10 operates as follows: If the input signal is at the first frequency (e.g., 800 MHz), it is provided to the first amplifier. Control circuit 40, responsive to control signal 41, enables first amplifier 20 to operate while prevents second amplifier 30 from operation. Input signal 29 is thus amplified by first amplifier 20. If the input signal is at the second frequency (e.g., 1900 MHz), the input signal is provided to second amplifier 30. Control circuit 40 enables second amplifier 30 while disables first amplifier 20, and the input signal is amplified by second amplifier 30. In this way, the amplifying apparatus operates on a signal having any of the two predetermined, different frequencies.

The selectively providing the signal to the first or second amplifier in accordance with signal frequency can be accomplished in many different ways. For example, in the context of cellular communications, it can be accomplished by a base station sending signal to a cellular phone indicating the frequency of the incoming signal; the cellular phone then sends a control signal to a switching circuit which directs the incoming signal to the appropriate amplifier. The same control signal also triggers the control circuit to enable the appropriate amplifier.

Figure 1B:
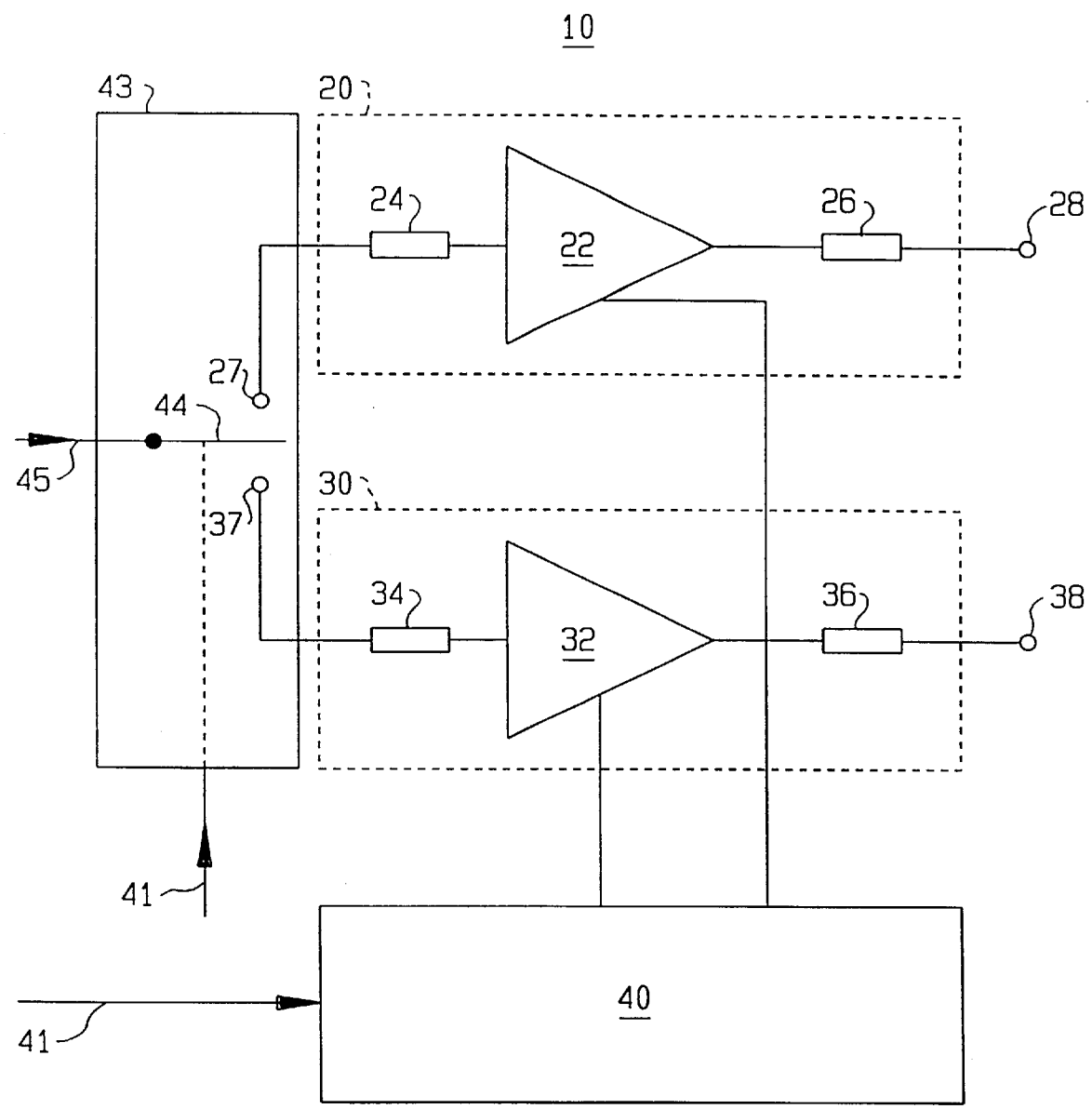
FIG. 1B is the block diagram of another multi-band amplifier of the present invention.

Referring to FIG. 1B, a switch circuit 43 is used to selectively provide input signal 45 to amplifier 20 or 30. Illustratively, switch circuit 43 includes a switch 44 responsive to control signal 41. If incoming signal 45 is at the first frequency, control signal 41 commands switch 44 to provide the incoming signal to first amplifier 20; it also triggers control circuit 40 to enable first amplifier 20 and to disable second amplifier 30. Conversely, if the incoming signal is at the second frequency, the incoming signal is provided to second amplifier 30, and second amplifier 30 is enabled. Preferably, first amplifier 20, second amplifier 30, and bias control circuit 40 are formed as a monolithic integrated circuit and more preferably, a GaAs MMIC.

The term "frequency" used here refers to both individual frequencies and frequency bands. For example and without limitation, the first amplifier is suitable to operate in the 800 MHz band and the second amplifier is suitable to operate in the 1900 MHz band. An amplifying apparatus capable of operating in different frequency bands is within the scope of the present invention.

Figure 2:
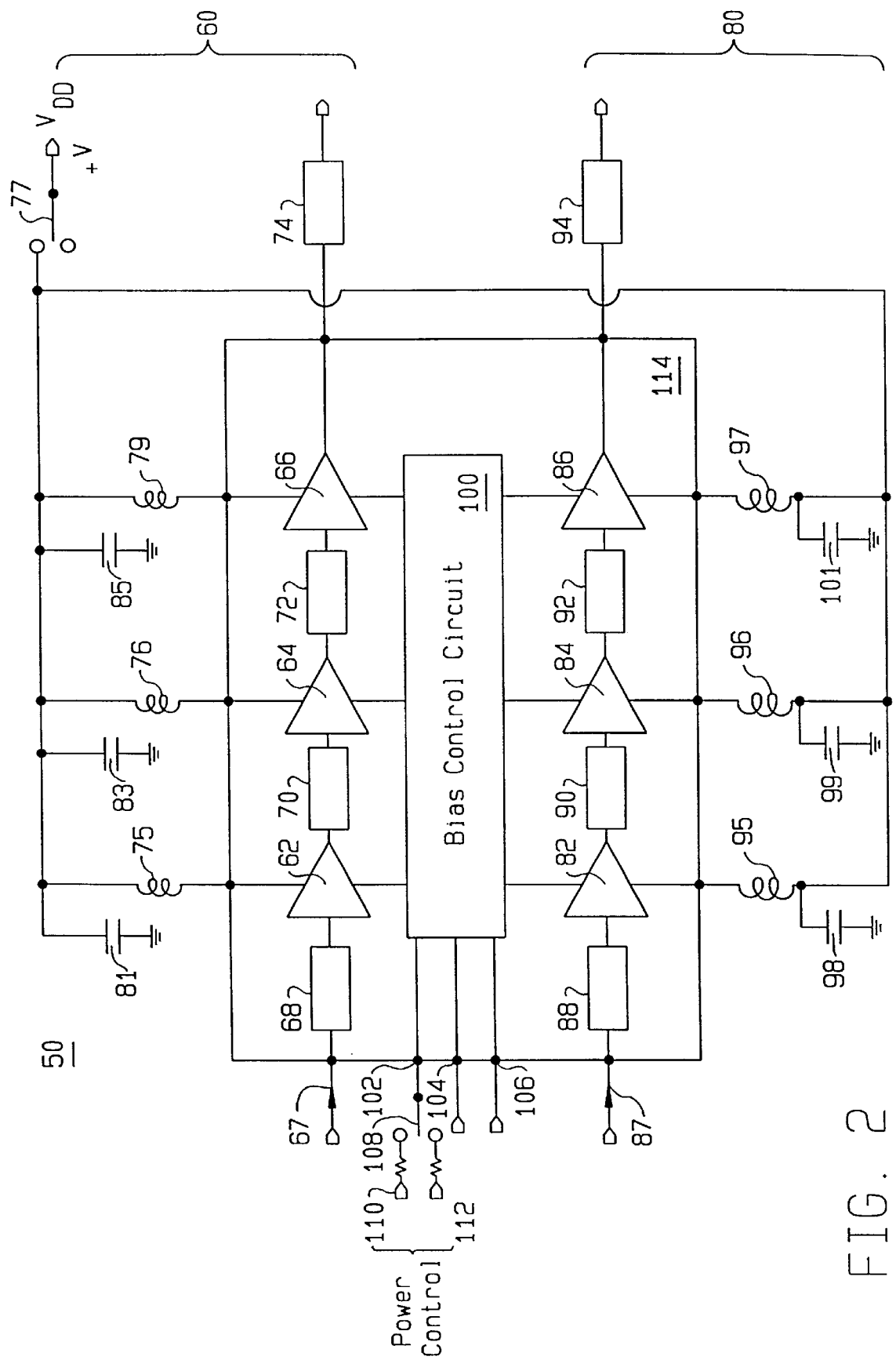
FIG. 2 is the block diagram of a preferred embodiment of a multi-band amplifier of the present invention.

Referring to FIG. 2, a part-block and part-schematic diagram, a preferred amplifying apparatus 50 comprises a first amplifier 60 for amplifying the 800 MHz signal, a second amplifier 80 for the 1900 MHz signal and a bias control circuit 100.

First amplifier 60 comprises three amplifying stages 62, 64 and 66 arranged as a cascade. An impedance network 68 is connected to the input of first stage 62, and it operates with first stage 62 to provide matching impedance to input 800 MHz signal 67. Between first and second amplifying stages 62 and 64, there is connected an impedance network 70 which provides, in conjunction with an inductor 75, predetermined proper impedance between first stage 62 and second stage 64 for 800 MHz operation. Coupled between second stage 64 and third stage 66 is an impedance network 72 which provides, in conjunction with another inductor 76, proper predetermined impedance between second stage 64 and third stage 66 for the 800 MHz operation. The output of third stage 66 is connected to an impedance network 74 which operates with third stage 66 and an inductor 79 to produce predetermined, desired load impedance for the 800 MHz operation.

Amplifying stages 62, 64 and 66 are powered by a dc power supply $+V_{DD}$ through three choke inductors 75, 76 and 79, and an off-chip, on/off switch 77. Three capacitors 81, 83 and 85 are used to provide ac ground to the power supply. Inductors 75, 76 and 79 will effect the interstage impedance and the output impedance. If the inductance of inductors 75, 76 and 79 is large, however, their effect on the interstage impedance and the output impedance is negligible.

Second amplifier 80 for amplifying the 1900 MHz signal comprises three cascade amplifying stages 82, 84 and 86. The input of amplifying stage 82 is connected to an impedance network 88 which operates with amplifying stage 82 to provide impedance that matches source impedance for the 1900 MHz operation. At the output of third amplifying stage 86, an impedance network 94 operates with third stage 86 and an inductor 97 to provide predetermined, desired output impedance for the 1900 MHz operation. Impedance networks 90 and 92 and inductors 95, 96 and 97 provide predetermined, desired inter-stage impedance for 1900 MHz operation. Preferably, the impedance value of network 90 at 1900 MHz is such that matching impedance between stages 82 and 84 is achieved. Similarly, the impedance of impedance network 92 is such that matching impedance between amplifying stages 84 and 86 are obtained at around 1900 MHz. Second amplifier 80 is also powered by the dc power supply $+V_{DD}$ through a switch 77 and three choke inductors 96. Capacitors 98, 99 and 101 are used to provide AC ground to the power supply.

Bias control circuit 100 is connected to both amplifiers 60 and 80. In addition to selectively enabling one of amplifiers 60 and 80 to operate while preventing the other amplifier from operation, control circuit 100 also provides a predetermined bias to the selected one amplifier to bias it to a desired mode of operation. Bias control circuit 100 is connected to a switch 108 at a terminal 102 for receiving a control signal. A positive power supply $V_{DB}$ is provided to control circuit 100 at a terminal 104, and a negative dc power supply $V_{SS}$ is provided to control circuit 100 at a terminal 106.

Amplifying apparatus 50 operates as follows: For 800 MHz operation, switch 108 is connected to terminal 110 at which a reference voltage for 800 MHz operation is provided. Responsive to this reference voltage, bias control circuit 100 provides a negative voltage to three amplifying stages 82, 84 and 86 in the second amplifier to turn off these stages. At the same time, a proper bias is provided to amplifying stages 62, 64 and 66 for them to operate in a desired mode. The amplifying apparatus is thus ready for 800 MHz operation.

For 1900 MHz operation, switch 108 is connected to terminal 112 where a reference voltage for 1900 MHz operation is provided. In response to the reference voltage, bias control circuit 100 provides a negative bias to turn off the amplifying stages in first amplifier 60. A desired bias for the 1900 MHz operation is provided to second amplifier 80 by bias control circuit 100.

Preferably, a portion 114 of amplifying apparatus 50 is in the form of a GaAs monolithic microwave integrated circuit ("MMIC"). More preferably, depletion-mode GaAs field effect transistors are used for signal amplification.

Figure 3A:
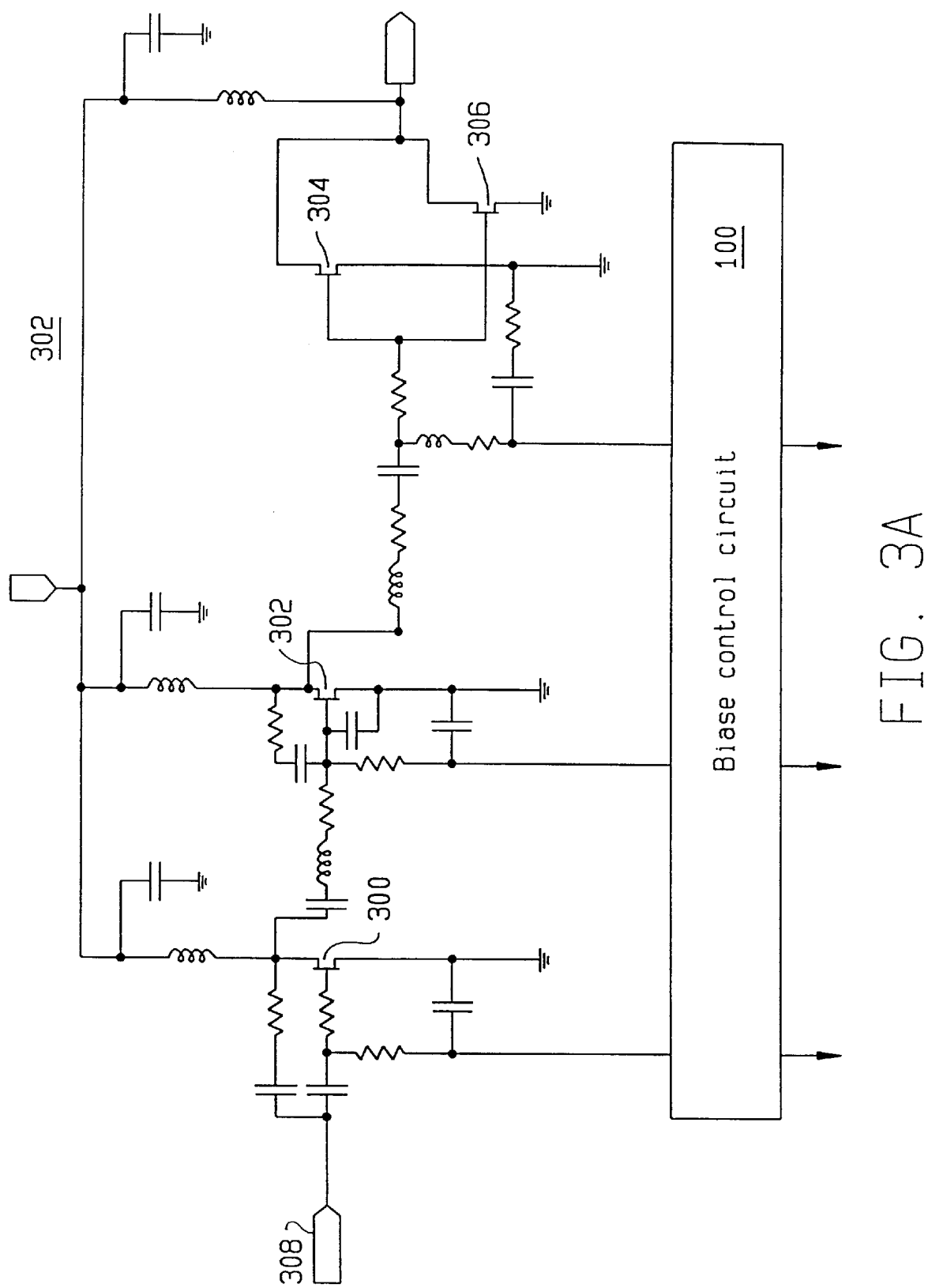
FIGS. 3A and 3B is a schematic-block diagram of a GaAs MMIC in accordance with the present invention which is used to form the multi-band amplifier of FIG. 2.
Figure 3B:
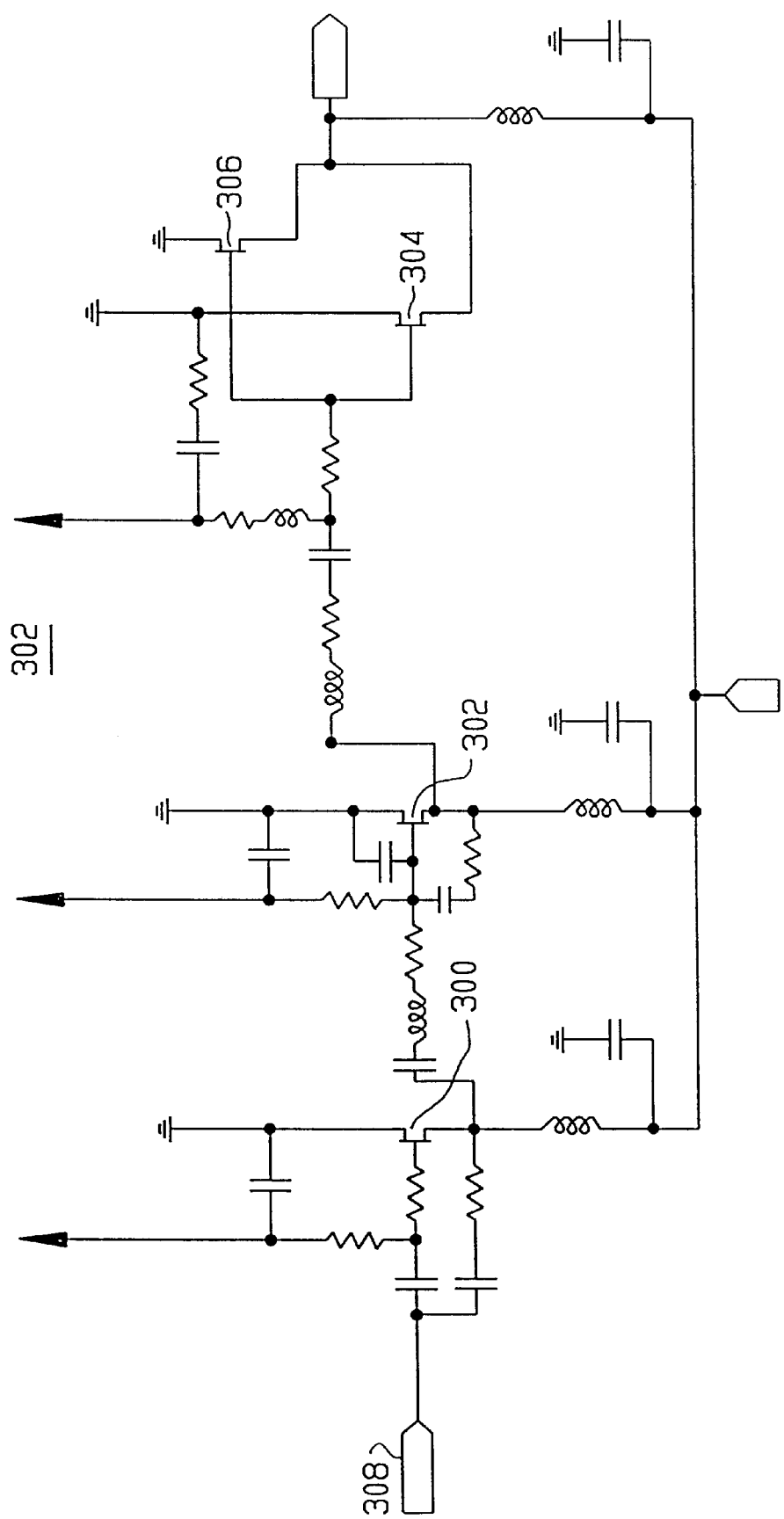

FIGS. 3A and 3B together illustrate a part-schematic circuit, part-block diagram of a preferred embodiment of the multi-band amplifier of FIG. 2. In each amplifier, the first two amplifying stages includes a depletion mode GaAs MESFET, and the last stage includes two depletion mode GaAs MESFETs for improved output power level. It will be apparent to one of skill in the art that there are numerous alternative ways to form the amplifying apparatus of FIG. 2; the circuit depicted in FIGS. 3A and 3B is merely an example and not a limitation.

In accordance with a second embodiment of the present invention, an amplifying apparatus is provided with at least one amplifying stage and input impedance means. The input impedance means provide, in accordance with the frequency of input signal, predetermined input impedance at the frequency of the input signal. Preferably, such predetermined input impedance is the impedance that matches source impedance. (Source impedance is the impedance of the signal source.)

The amplifying apparatus further includes output impedance means for providing, in accordance with the frequency of the signal, predetermined output impedance at the frequency of the input signal. In addition, a circuit for selectively biasing the amplifying stage to operate in a predetermined mode is also provided.

Figure 4:
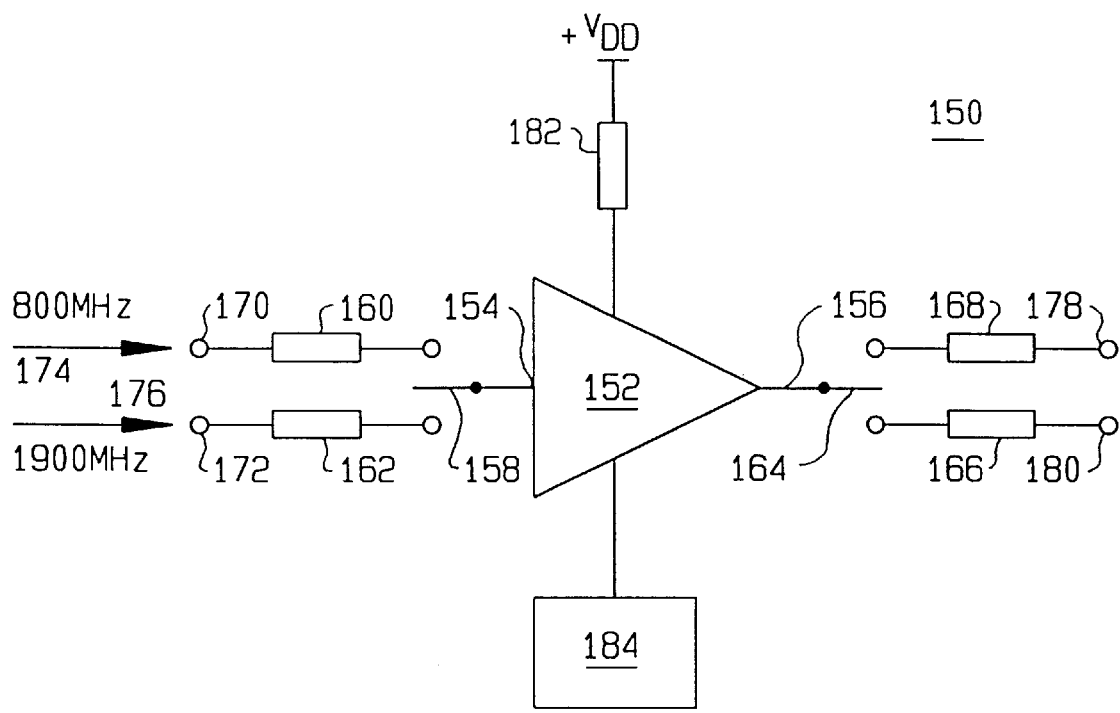
FIG. 4 is the block diagram of another embodiment of a multi-band amplifier of the present invention.

An example of this second embodiment is shown in a block diagram of FIG. 4. An amplifying apparatus 150 includes a single amplifying stage 152 having an input node 154 and an output node 156. Input node 154 is connected to a switch 158 which is selectively connected to either input impedance network 160 or 162. Output node 156 is connected to a switch 164 for selectively coupling to either output impedance network 166 or 168.

Input signal 174 of a first frequency (e.g., 800 MHz) is received by the amplifying apparatus at a terminal 170 connected to impedance network 160. Input signal of a second frequency (e.g., 1900 MHz) is received at a terminal 172 connected to impedance network 162. For simplicity, 800 MHz and 1900 MHz are used here to represent the 800 MHz cellular band and the 1900 MHz PCS band; they are also referred here as the 800 MHz operation and the 1900 MHz operation. It will be apparent to one of skill in the art that these two frequencies are merely illustrative—the amplifying apparatus of the present invention can be adapted to operate at other frequencies or frequency bands, or at more than two frequencies, which are all within the scope of the present invention.

Amplifying apparatus 150 provides output signal at 800 MHz, through an output impedance matching network 168, at output terminal 178. A 1900 MHz output signal is provided, through output impedance network 166, at an output terminal 180. Amplifying apparatus 150 receives dc power from a dc power supply +V$_{DD}$ through an impedance network 182. A bias control circuit 184 is used to selectively bias the amplifying stage to operate in a desired mode. For example, amplifying stage 152 can be biased for class A, B, AB or C operation.

Predetermined impedance for 800 MHz operation is provided by impedance networks 160, 168 and 182 in conjunction with amplifying stage 152. More specifically, input impedance networks 160 operating in conjunction with amplifying stage 152 provides input impedance that approximately matches source impedance at 800 MHz. Predetermined output impedance is provided for the 800 MHz operation by output impedance network 168 in conjunction with amplifying stage 152 and impedance network 182. If the impedance of network 182 is large (such as a large choke inductor), its effect on the output impedance is negligible and the output impedance of amplifying apparatus 150 is mainly determined by output impedance network 168 and amplifying stage 152.

Similarly, for the 1900 MHz operation, proper impedance is provided by impedance networks 162, 166 and 182 in conjunction with amplifying stage 152. Input impedance matching source impedance at 1900 MHz is obtained by impedance network 162 operating in conjunction with amplifying stage 152. Predetermined output impedance for the 1900 MHz operation is achieved by impedance networks 166 and 182 operating in conjunction with amplifying stage 152.

The term "impedance network" or "impedance matching network" is used here to refer to any electronic component or circuit thereof that displays a predetermined impedance at a frequency. It includes, without limitation, passive components, such as capacitors, resistors and inductors, and active components, such as transistors, diodes and circuits thereof.

Amplifying apparatus 150 operates as follows: For the 800 MHz operation, the input of amplifying stage 152 is connected to impedance network 160, and the output of the amplifier is connected to impedance network 168. A desired bias is provided to amplifying stage 152 by bias circuit 184. If the input signal is at 1900 MHz, impedance networks 162 and 166 are connected to the input and output of amplifying stage 152, respectively, and a desired bias for the 1900 MHz operation is provided to amplifying stage 152 by bias circuit 184.

It will be apparent to one of ordinary skill in the art that, although FIG. 4 depicts a dual-band amplifier, an amplifying apparatus for more than two bands can also be provided in accordance with the present invention, which is within the scope of the present invention.

It will also be apparent to one of ordinary skill in the art that the essence of the present invention is to provide predetermined input and output impedance and predetermined bias to the amplifier for different frequency operations. The embodiment of FIG. 4 illustrates an example for providing predetermined input and output impedance for different frequency operations by using switching input impedance networks and switching output impedance networks. As will be appreciated by one of skill in the art, there will be numerous ways to provide, in accordance with the present invention, predetermined input and output impedance according to the signal frequency, which are all within the scope of the present invention. Some of the alternative embodiments of the present invention will now be described below.

Figure 5A:
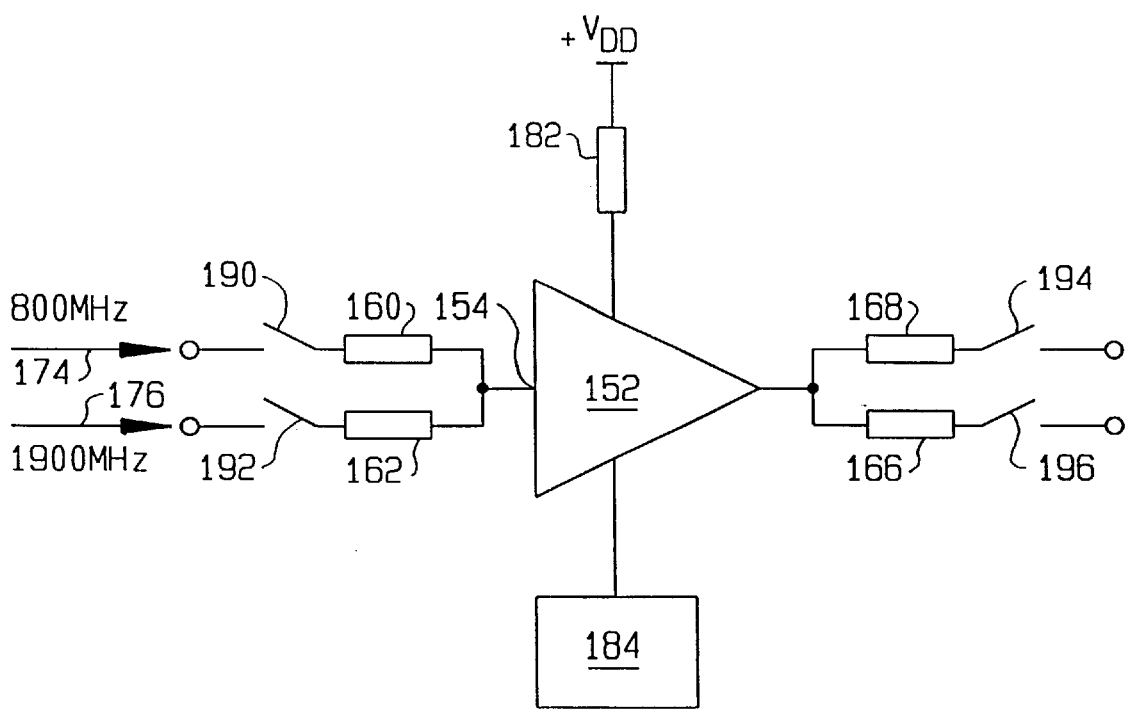
FIGS. 5A–E are block diagrams of alternative embodiments of a multi-band amplifier of the present invention.

FIG. 5A is the block diagram of an alternative embodiment wherein like elements are similarly designated as FIG. 4. For the 800 MHz operation, switches 190 and 194 are closed, and switches 192 and 196 are open. For the 1900 MHz operation, switches 192 and 196 are closed and switches 190 and 194 are open.

Figure 5B:
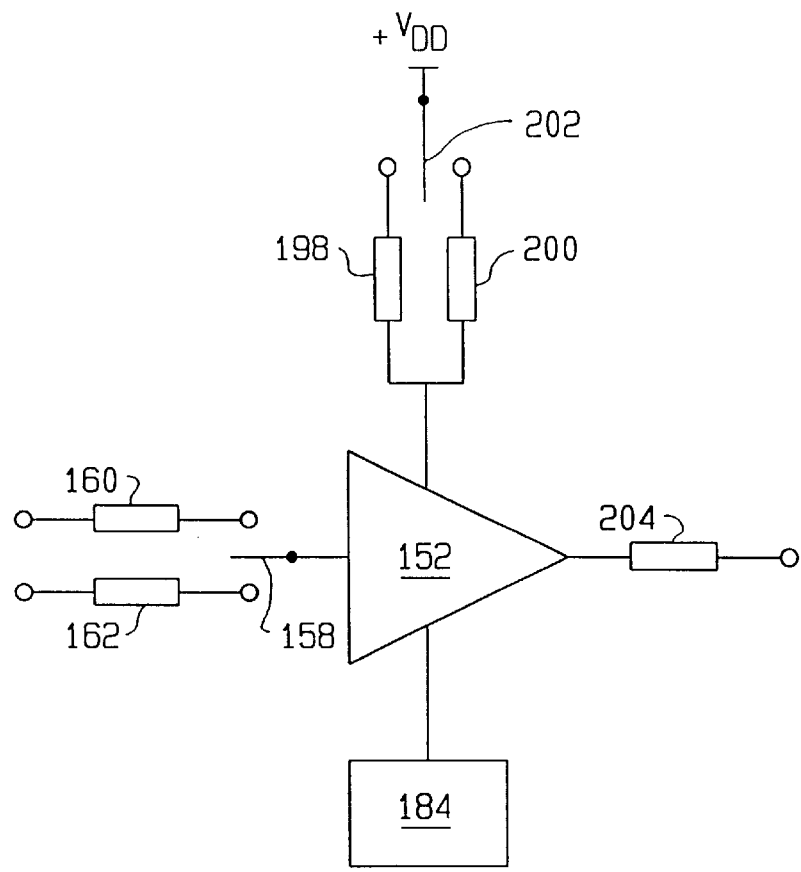

FIG. 5B illustrates another alternative embodiment. Amplifying stage 152 is coupled to the dc power supply +V$_{DD}$ through one of two output impedance networks 198 and 200 by a switch 202. An impedance network 204 is connected to the output of the amplifying stage. Predetermined output impedance at 800 MHz is provided by connecting a switch 202 to impedance network 198 for the 800 MHz operation. For the 1900 MHz operation, predetermined output impedance at 1099 MHz is provided by connecting switch 202 to impedance network 200.

It should be noted that in this embodiment, predetermined output impedance for different frequency applications is obtained by switchably connecting impedance network 198 or 202 to the power supply. As is well known to those of skill in the art, an impedance component connected to the dc power supply in the shown fashion has a direct effect on the output impedance of the amplifying stage. Clearly, the impedance values for impedance networks 198, 200 and 204 need to be such that desired output impedance for the 800 MHz or 1900 MHz operation is provided.

Figure 5C:
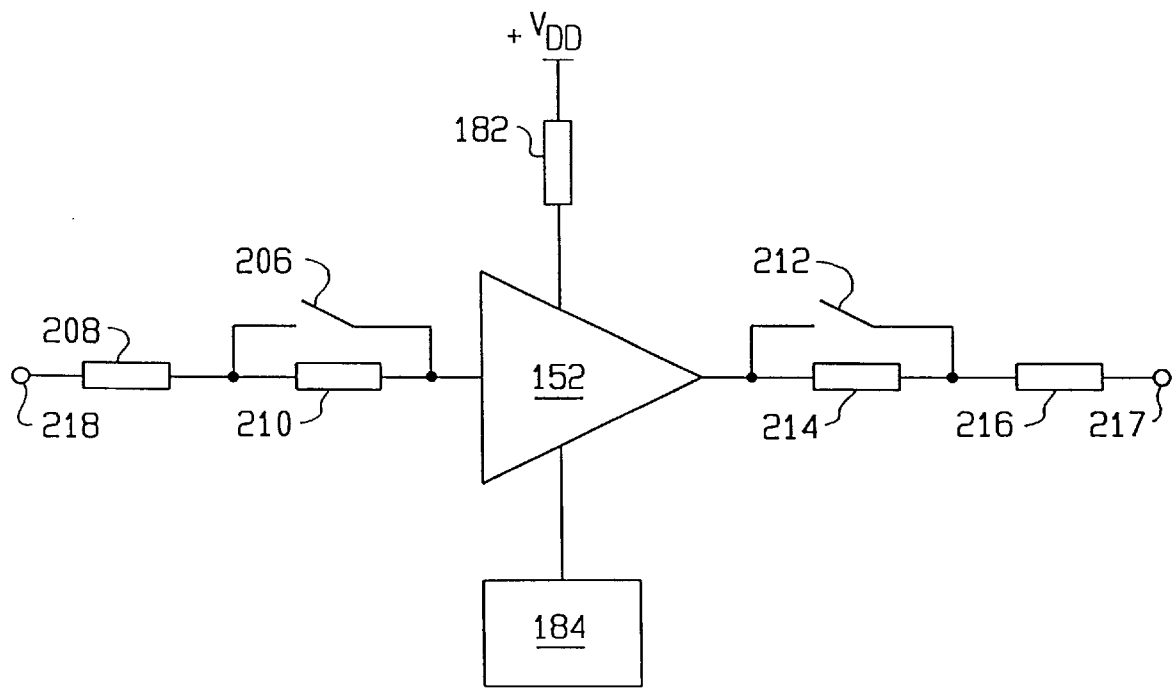

FIG. 5C is a block diagram depicting yet another way of providing predetermined input and output impedance for different frequency or frequency band operations. In this embodiment, input of amplifying stage 152 is connected to two impedance networks 208 and 210 connected in series. A switch 206 is connected across impedance network 210 and when closed, it shorts network 210. Similarly, the output of amplifying stage 152 is connected to two impedance networks 214 and 216 connected in series, with a switch 212 connected across network 214.

This amplifying apparatus operates as follows: Both switches 206 and 212 are open for the 800 MHz operation. At an input terminal 218, predetermined input impedance (e.g., about 50 ohms), preferably matching the source impedance, is provided by impedance networks 208 and 210 operating in conjunction with amplifying stage 152. At an output terminal 217, predetermined output impedance (e.g., about 5 ohms) is provided by impedance networks 214 and 216 operating in conjunction with amplifying stage 152 and impedance network 182. If impedance network 182 has a large impedance, its effect on the output impedance is negligible and the output impedance is mainly determined by networks 214 and 216 and amplifying stage 152.

Both switches 206 and 212 are closed for the 1900 MHz operation, shorting impedance networks 210 and 214. Under this configuration, predetermined input impedance (e.g., about 50 ohms) is maintained at around 1900 MHz by impedance network 20 and amplifying stage 152. Predetermined output impedance (e.g., about 5 ohms) is maintained by impedance networks 216 and 182 and amplifying stage 152. One advantage of this amplifying apparatus over the previously described ones is that it requires only a single input terminal and a single output terminal for both the 800 MHz and the 1900 MHz operations. If one desires, input impedance networks 208 and 210 can be such that predetermined, different input impedance for the 800 MHz and 1900 MHz operations be obtained. Similarly, predetermined, different output impedance for the 800 MHz and 1900 MHz operations can also be obtained.

Figure 5D:
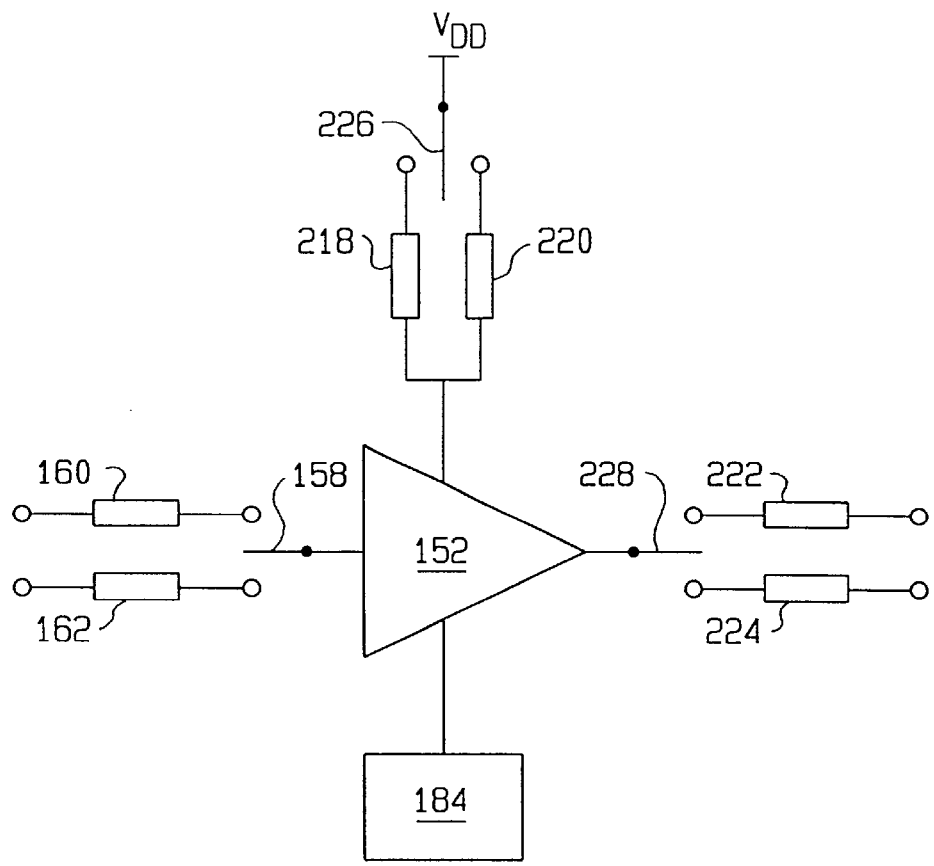

FIG. 5D depicts another alternative embodiment wherein two pairs of switching impedance networks are used for providing desired, predetermined output impedance for different frequency operations. Specifically, for the 800 MHz operation, a switch 158 is connected to an impedance network 160 which, in conjunction with amplifying stage 152, provides predetermined input impedance for the 800 MHz operation. To provide predetermined output impedance, a switch 226 connects to an impedance network 218 and a switch 228 connects to an impedance network 222; impedance networks 218 and 222 provide, with the amplifying stage, predetermined output impedance for the 800 MHz operation. For the 1900 MHz operation, switch 158 connects to an impedance network 162, switch 226 connects to an impedance network 22, and switch 228 connects to an impedance network 224; the impedance values of these networks are such that desired input and output impedance is provided for the 1900 MHz operation.

Figure 5E:
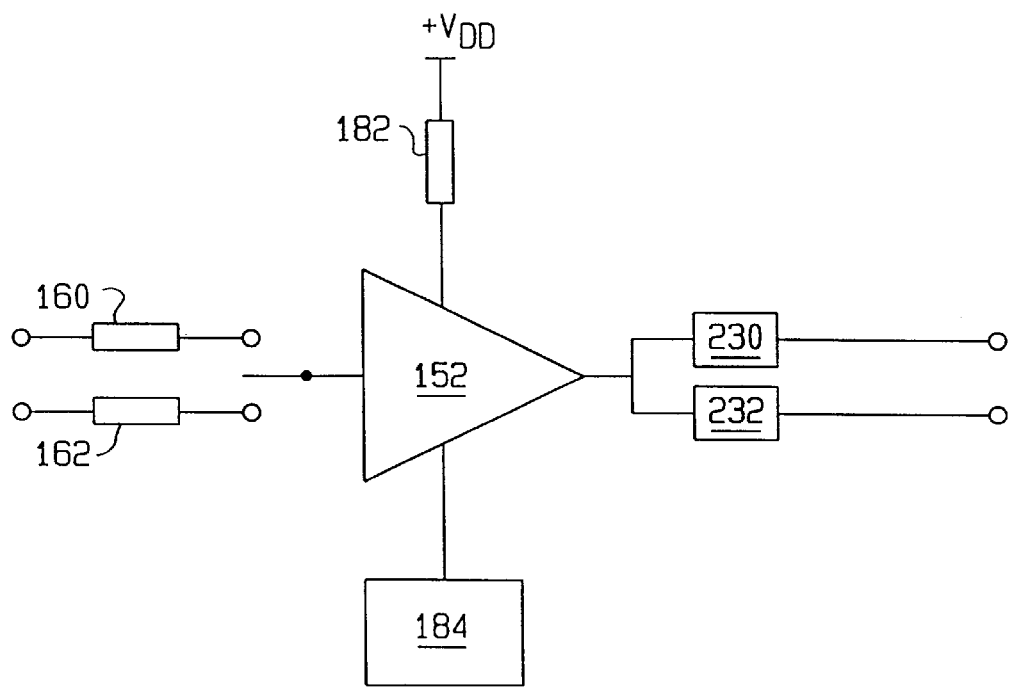

In accordance with the present invention, frequency filters/impedance networks are also used in providing predetermined input and output impedance for different frequency operations. By example and not limitation, as illustrated in FIG. 5E, a low-pass filter/impedance network 230 and a high-pass filter/impedance network 232 are connected to the output of amplifying stage 152. For the 800 MHz operating, low-pass filter/impedance network 230 allows 800 MHz signal to pass through and provides predetermined output impedance within the 800 MHz band. When the signal is 1900 MHz, it passes through high-pass filter/impedance network 232, which provides predetermined output impedance within the 1900 MHz band. Low pass and high pass filters can also be used in a similar fashion at the input end of the amplifying stage (not shown), which is within the scope of the present invention.

The amplifying apparatus described thus far contains a single amplifying stage. For a multiple stage amplifier, in addition to providing predetermined input impedance and output impedance, it is also required that proper impedance between successive stages be provided. Preferably, the output impedance of a preceding stage approximately matches the input impedance of a following stage. For the 800 MHz operation, impedance matching between stages is not critical since sufficient gain is easily obtained even without interstage impedance matching. In fact, interstage impedance mismatching may be desired in certain instances to reduce the gain. For the 1900 MHz operation, however, because the gain is more difficult to achieve, impedance matching between stages is important. In accordance with the present invention, predetermined impedance between successive stages of an amplifier is provided for different frequency operations.

Figure 6A:
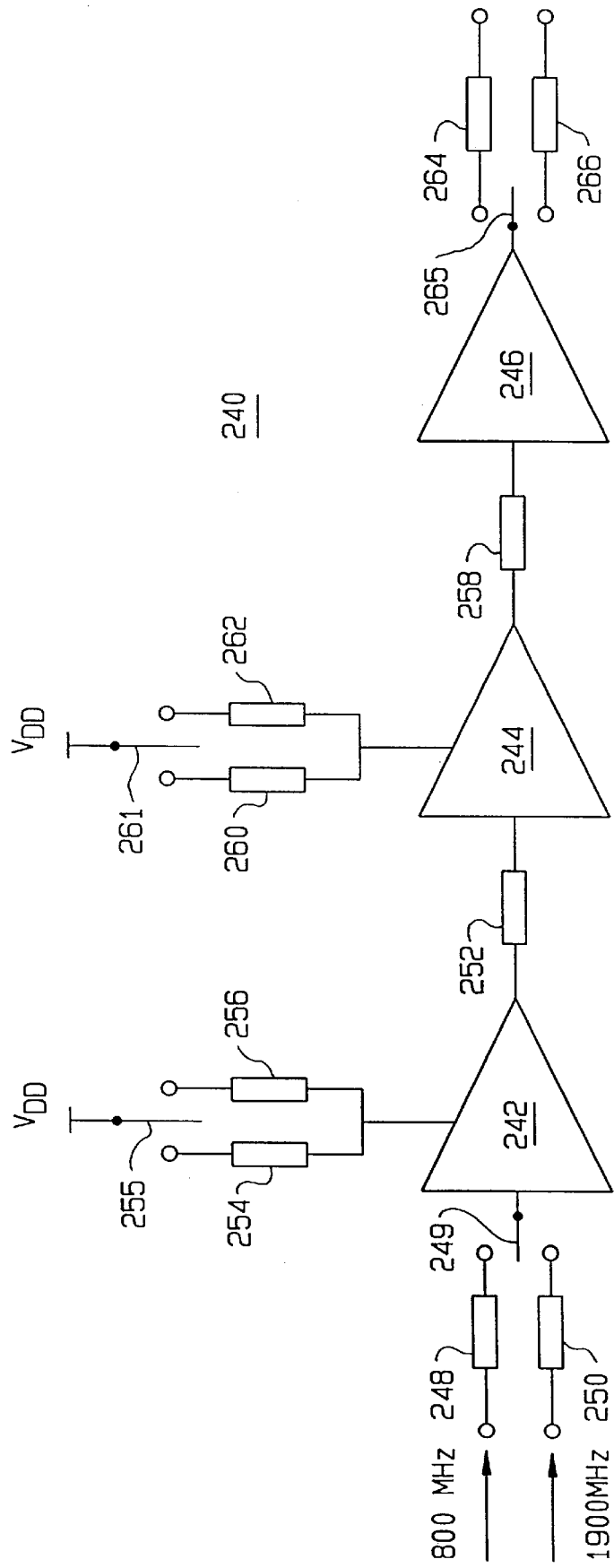
FIG. 6A is the block diagram of a preferred embodiment of a multi-stage, multi-band amplifier of the present invention.

FIG. 6A is a block diagram of a multi-stage amplifying apparatus 240 in accordance with the present invention. The apparatus includes three amplifying stages: a first stage 242, a second stage 244, followed by an output stage 246. Connected to the input of first amplifying stage 242 is a switch 249, which switchably connects to an impedance network 248 or 250. For the 800 MHz operation, switch 249 connects to impedance network 248 which operates in conjunction with first amplifying stage 242 to provide predetermined input impedance. Switch 249 connects to impedance network 250 for the 1900 MHz operation which operates in conjunction with first amplifying stage 242 to provide desired input impedance for the 1900 MHz operation. Preferably, the input impedance provided by impedance network 248 or 250 is about 50 ohms to match source impedance.

Proper interstage impedance between first and second stages is provided with the use of switches 255 and 261 and impedance networks 254, 256, 260 and 262. For the 800 MHz operation, switch 255 connects to network 254 which, together with impedance network 252 and first amplifying stage 242, provides predetermined interstage impedance suitable for the 800 MHz operation. Switch 255 connects to impedance network 256 for the 1900 MHz operation, which, together with impedance network 252 and first amplifying apparatus 242, provides predetermined interstage impedance. Preferably, for the 1900 MHz operation, the output impedance of first stage 242 approximately matches the input impedance of second stage 244. Similarly, predetermined interstage impedance between second amplifying stage 244 and third amplifying stage 246 is provided by connecting switch 261 to impedance network 260 for the 800 MHz operation, or to impedance network 262 for the 1900 MHz operation.

Figure 6B:
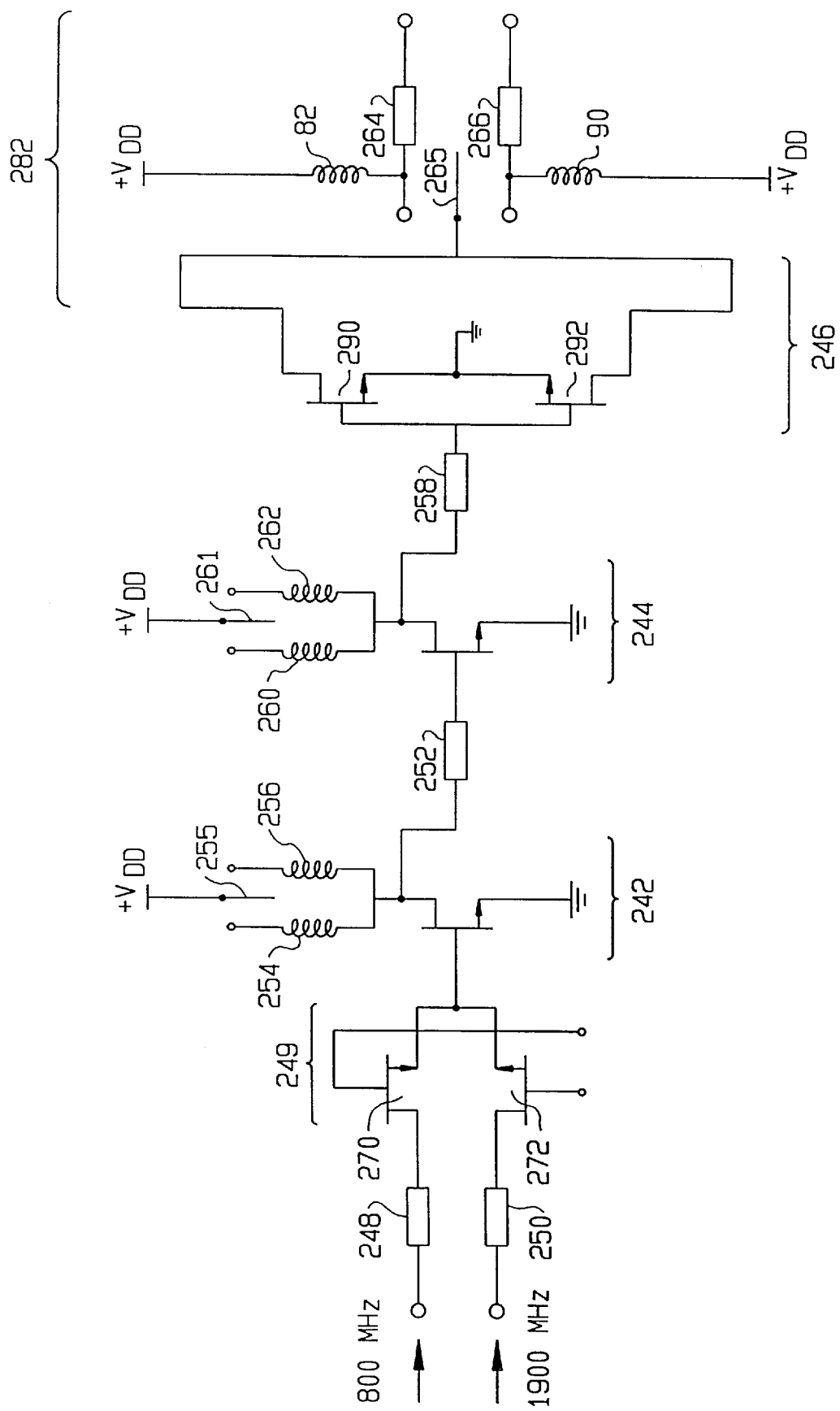
FIG. 6B is a schematic-block diagram of the amplifier of FIG. 6A.

FIG. 6B is a part-block and part-schematic diagram depicting a more preferred embodiment of the amplifying apparatus of FIG. 6A. Like elements in this drawing are similarly designated as in FIG. 6A. Two depletion mode GaAs FETs 270 and 272 are used to form a switch 249, and they are controlled by proper voltages applied to their gate terminals. For the 800 MHz operation, FET 270 is turned on and PET 272 is turned off. Conversely, for the 1900 MHz operation, FET 270 is ted off and FET 272 is turned on. Although this embodiment uses two depletion mode GaAs FETs 270 and 272 to form switch 249, it will be apparent to one of ordinary skill in the art that other devices such as PN diodes, Schottky diodes, or preferably, PIN diodes can be used instead of the GaAs FETs to form the switch, which are all within the scope of the present invention.

An output stage 246 includes two depletion mode GaAs FETs connected in parallel. The drain terminals of the two FETs are biased by a dc power supply $+V_{DD}$ through one of two inductors 82 and 90, which is selectively connected to the drain terminals by a switch 265. This two FET type stage provides improved output power capability.

Illustratively, depletion mode GaAs FETs are used as amplifying transistors in all three stages. It will be apparent to one of skill in the art that other kinds of transistors such as bipolar transistors or enhancement mode GaAs FETs can be used instead of the GaAs FETs, which are all within the scope of the present invention.

Figure 7A:
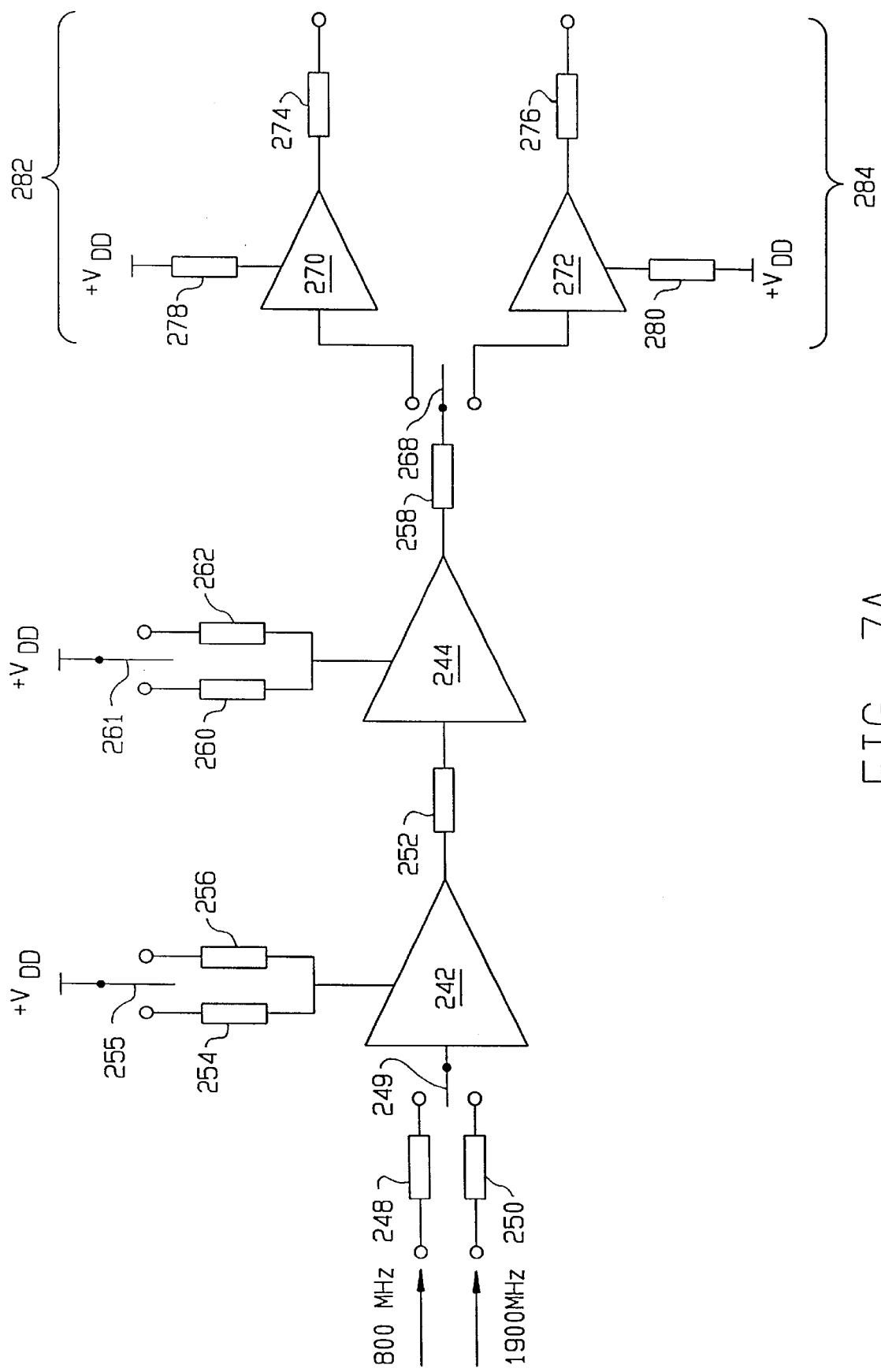
FIG. 7A is the block diagram of an alternative embodiment of a multistage, multi-band amplifier of the present invention.

FIG. 7A is the block diagram of another alternative embodiment of the amplifying apparatus of FIG. 6A. The output stage of this embodiment includes two substages 282 and 284 for the 800 MHz or 1900 MHz operation, respectively. Depending on the frequency of operation, only one of the two substages is selectively activated and the selection is made by a switch 268. For the 800 MHz operation, switch 268 is connected to substage 282 which provides predetermined output impedance at its output while substage 284 is turned off. Switch 268 connects to substage 284 for the 1900 MHz operation, which provides proper output impedance for the 1900 MHz operation while substage 282 is turned off.

Figure 7B:
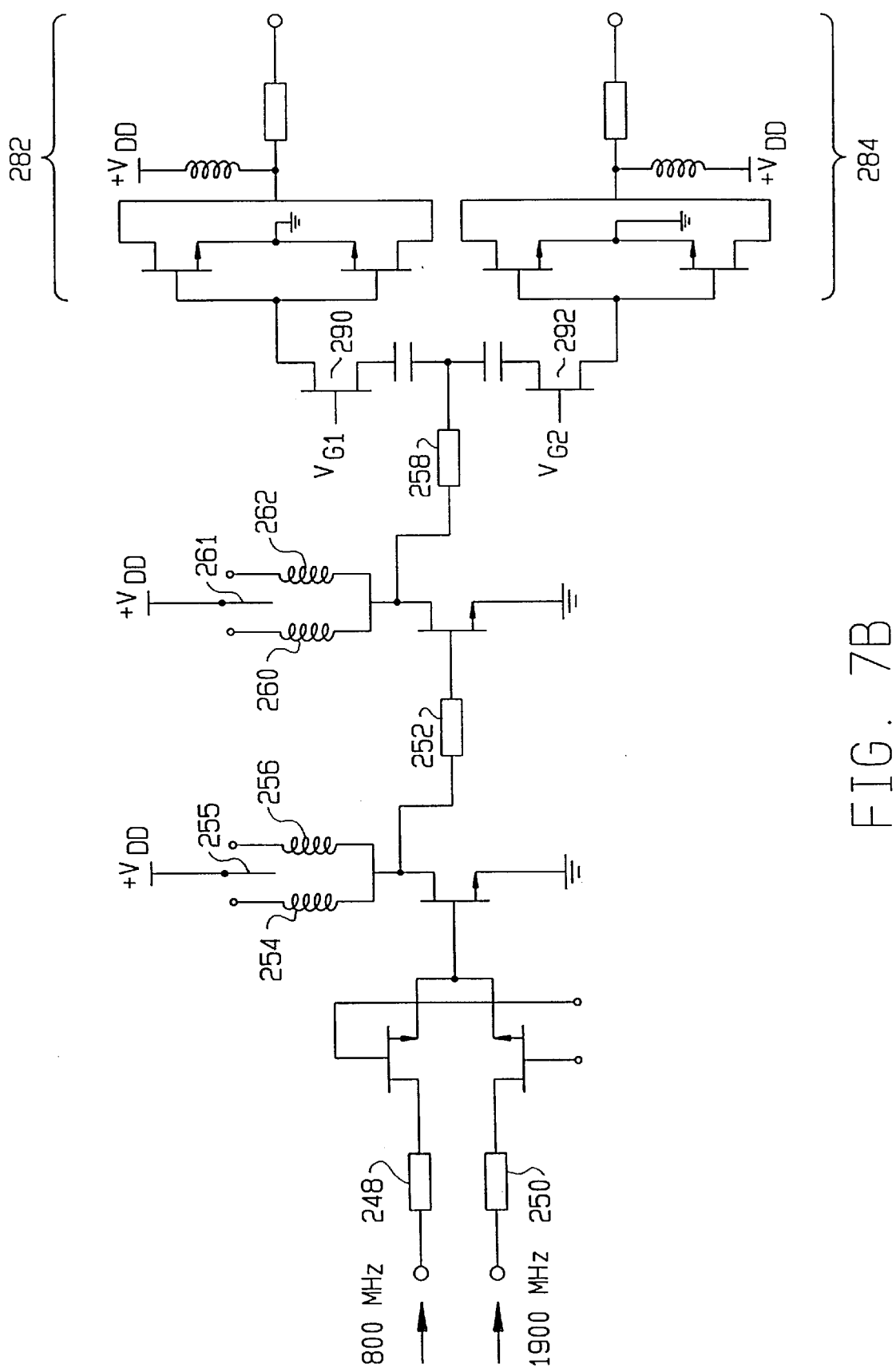
FIG. 7B is a schematic-block diagram of the amplifier of FIG. 7A.

FIG. 7B is a part-block and part-schematic diagram of a more preferred embodiment of the amplifying apparatus of FIG. 7A. Note that two FETs 290 and 292 are used as a switch for the output stage. By applying appropriate gate bias voltages $V_{G1}$ and $V_{G2}$, a desired substage is selected. For example, for the 800 MHz operation, substage 284 is electrically disconnected from the second stage by applying a gate bias $V_{G2}$ of a negative voltage sufficient to turn off FET 292. In the meantime, substage 282 is electrically connected to the second stage by a gate bias $V_{G1}$ which turns on FET 290. Conversely, for the 1900 MHz operation, substage 282 disconnected by turning off FET 290 and substage 284 is selected by turning on FET 292.

Figure 8:
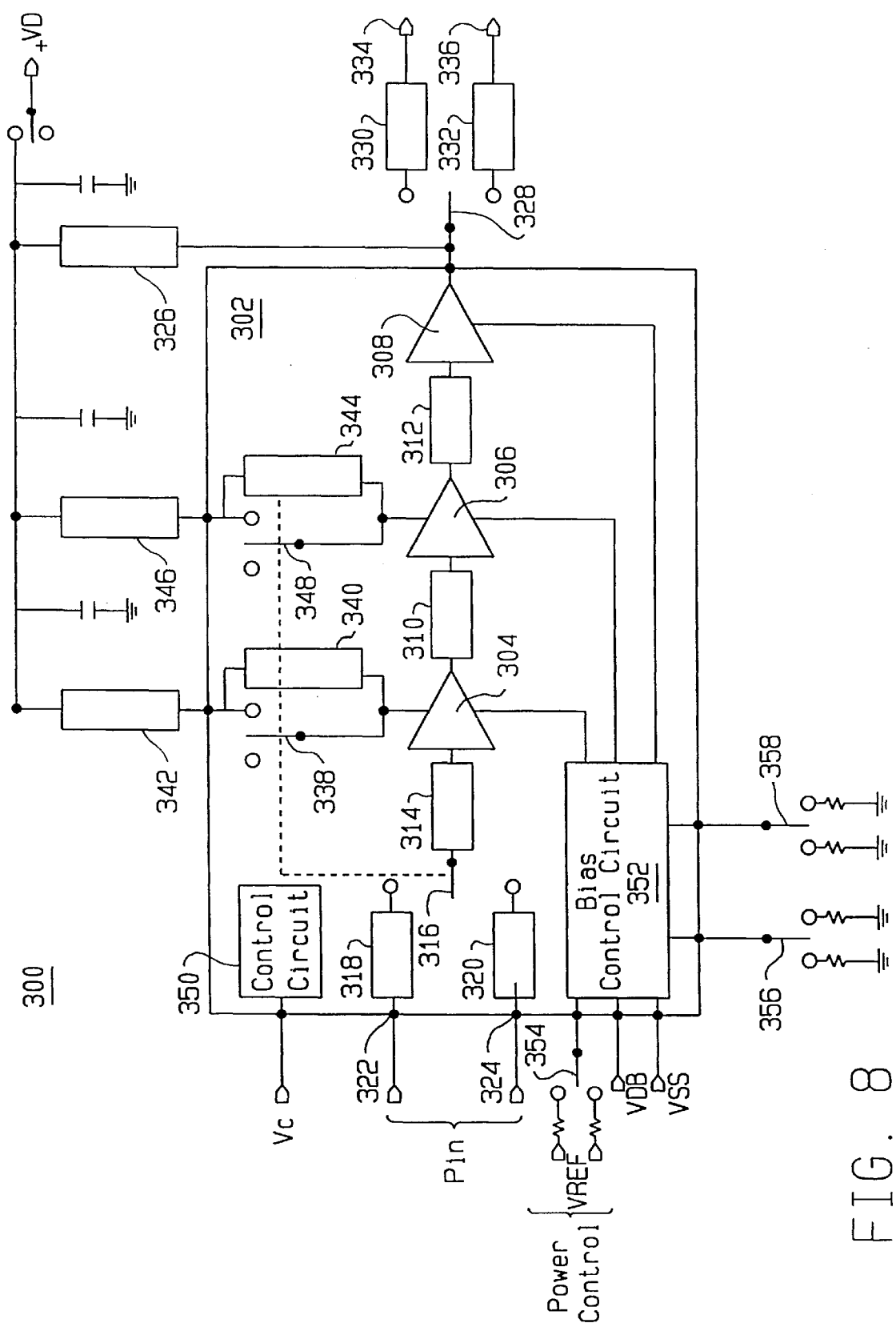
FIG. 8 is the block diagram of a preferred embodiment of a multi-stage, multi-band amplifier of the present invention.

FIG. 8 depicts the block diagram of a preferred multi-band amplifying apparatus 300 of the present invention. Amplifying apparatus 300 includes a GaAs MMIC power amplifier chip 302 and a number of off-chip components. In the GaAs power amplifier chip, three amplifying stages 304, 306 and 308 are connected as a cascade through impedance networks 310 and 312. A switch 316 is connected to the input of first stage 304 through an impedance network 314 and it selectively connects to either an impedance network 318 or an impedance network 320. Impedance network 318 receives input 800 MHz signal at a terminal 322. Impedance network 320 receives input 1900 MHz signal at a terminal 324. When switch 316 connects to impedance network 318, predetermined input impedance for the 800 MHz operation is provided at input terminal 322. Switch 316 connects to impedance network 320 for the 1900 MHz operation; impedance network 320 operates with first stage 304 to provide predetermined input impedance for the 1900 MHz operation.

Two switching impedance networks are used to provide predetermined output impedance for the 800 MHz or 1900 MHz operation. More specifically, the output of the third stage is connected to an off-chip switch 328, which is selectively connected to either an off-chip impedance network 330 for the 800 MHz operation or an off-chip impedance network 332 for the 1900 MHz operation. The output of the third stage is also connected to an off-chip impedance network 326 to receive the dc power $+V_{DD}$. When switch 328 connects to impedance network 330, predetermined output impedance for the 800 MHz operation is provided at a terminal 334 by impedance networks 330 and 326 operating in conjunction with third stage 308. For the 1900 MHz operation, switch 328 is connected to impedance network 332 and predetermined output impedance is provided at terminal 336 by impedance networks 332 and 326 operating in conjunction with third stage 308.

Predetermined inter-stage impedance for different frequency operations is obtained in this amplifying apparatus by using switching impedance networks. More specifically, first stage 304 is connected to the dc power supply $+V_{DD}$ via an on-chip impedance network 340 and an off-chip impedance network 342. Connected across impedance network 340 is an on-chip electronic switch 338 which, if closed, shorts impedance network 340. For the 800 MHz operation, switch 338 is open and predetermined, proper interstage impedance between first amplifying stage 304 and second amplifying stage 306 for the 800 MHz operation is provided by impedance networks 310, 340 and 342.

When the apparatus operates within the 1900 MHz band, switch 338 is closed, shorting impedance network 340. At this time, predetermined, proper interstage impedance between first amplifying stage 304 and second stage 306 is provided by impedance networks 342 and 310. Preferably, the impedance values of impedance networks 342 and 310 are such that matching impedance between the first and second stage is obtained for the 1900 MHz operation.

Predetermined inter-stage impedance between second amplifying stage 306 and third amplifying stage 308 for the 800 MHz or 1900 MHz operation is similarly obtained with the use of on-chip impedance networks 312 and 344, an on-chip electronic switch 348 and an off-chip impedance network 346. Switch 348 is open for the 800 MHz operation, and it is closed for the 1900 MHz operation.

GaAs MMIC power amplifier chip 302 further includes an on-chip control circuit 350 for controlling electronic switches 316, 338 and 348. In the figure, the dash lines connecting these switches to control circuit 350 illustrate the control of these switches by control circuit 350. For the 800 MHz operation, responding to a control signal $V_C$ received from an off-chip source, control circuit 350 causes switch 316 to connect to impedance network 318, and opens switches 338 and 348. For the 1900 MHz operation, it causes switch 316 to connect to impedance network 320, and closes switches 338 and 348. Control signal $V_C$ triggers the control circuit to generate proper signals to control those switches; it can be, by example and not limitation, a signal responsive to a cellular base station.

GaAs MMIC power amplifier chip 302 further includes a bias control circuit 352 for providing appropriate bias to amplifying stages 304, 306 and 308. For example, depending on the particular PCS system under which the amplifying apparatus is to be used, amplifying stage 304, 306 and 308 can be biased for A, B, AB or C operation. Bias control circuit 352 is connected to a number of off-chip voltages: a positive voltage supply $V_{DB}$, a negative voltage supply $V_{SS}$, and a reference voltage $V_{REF}$. Reference voltage $V_{Ref}$ is provided to bias control circuit 352 through a switch 354. Bias control circuit 352 can also be connected to two pairs of optional bias resistors through two off-chip electronic switches 356 and 358. The optional bias resistors are used to form, with on-chip resistors, a voltage divider by which the bias voltage can be adjusted by judiciously choosing the resistance values of these optional bias resistors.

Figure 9:
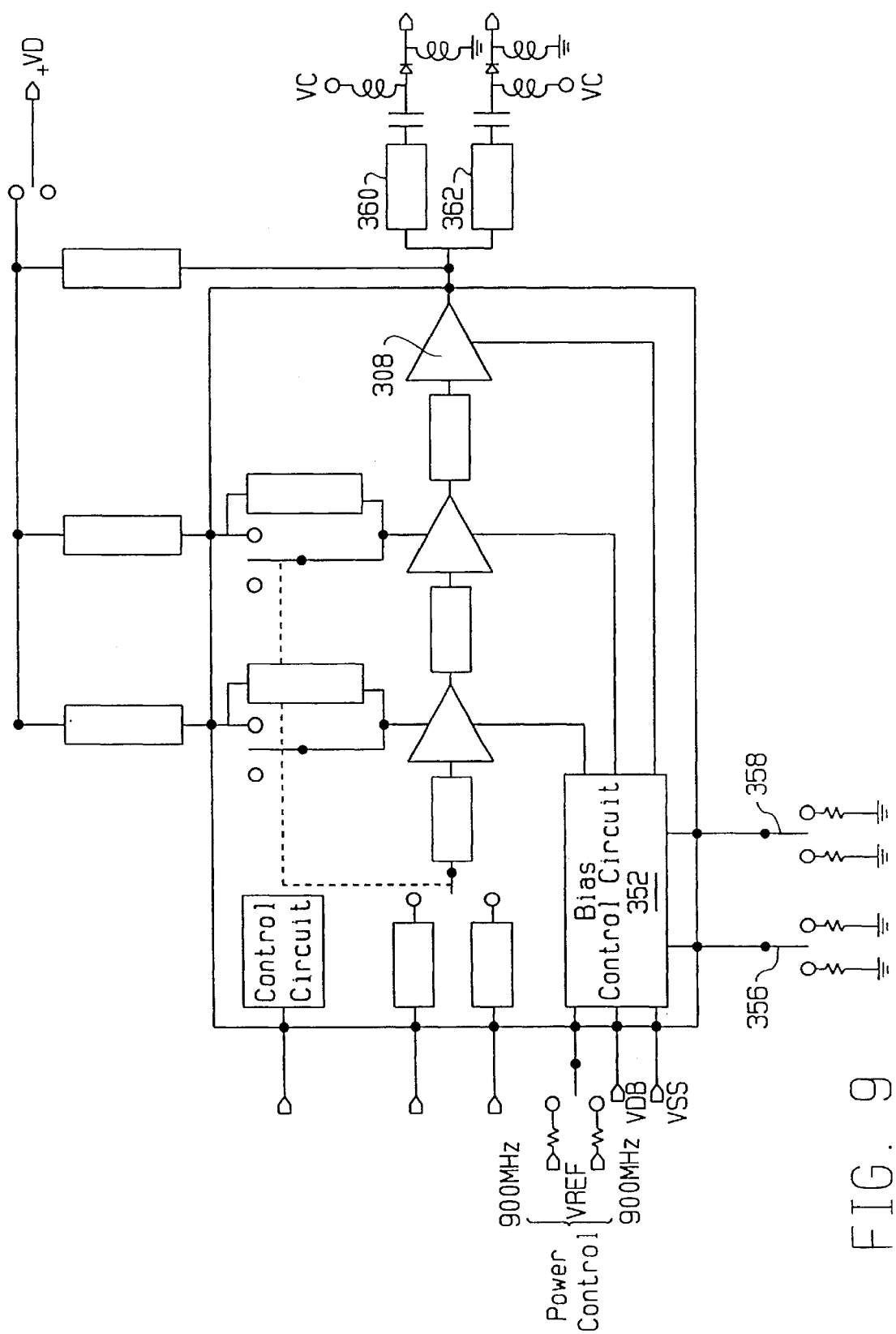
FIG. 9 is the block diagram of an alternative embodiment of the amplifier depicted in FIG. 8.

Referring to FIG. 9, in an alternative embodiment, the output of third amplifying stage 308 is connected to a low-pass impedance network 360 and a high-pass impedance network 362. The 800 MHz signal will pass the low-pass impedance network which provides predetermined output impedance for the 800 MHz operation. The 1900 MHz signal will pass the high-pass impedance network 362 which provides predetermined output impedance for the 1900 MHz operation.

Figure 10:
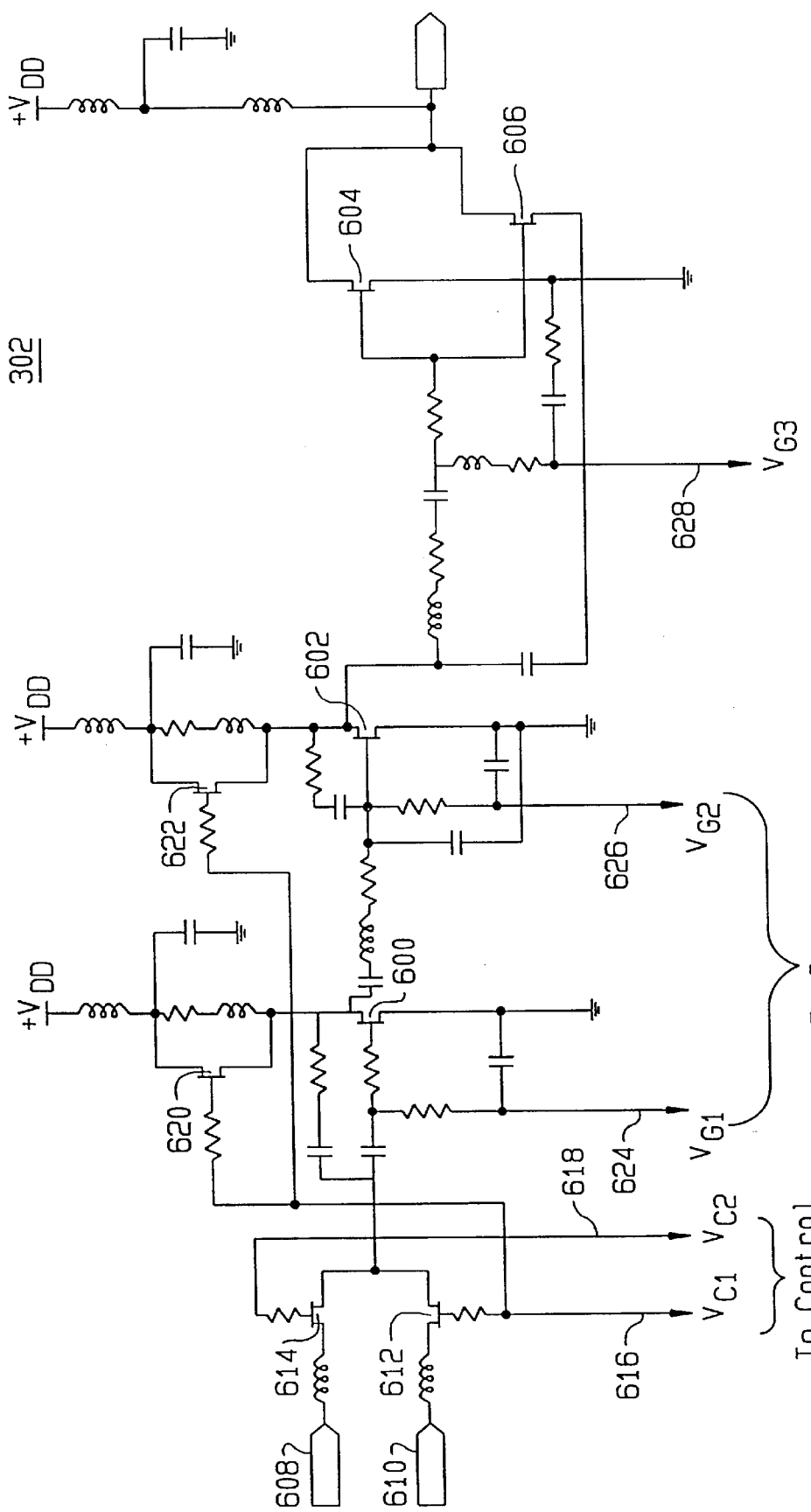
FIG. 10 is the schematic circuit diagram of a GaAs MMIC of the present invention which is used to form the multi-band amplifier of FIGS. 8 and 9.
Figure 11:
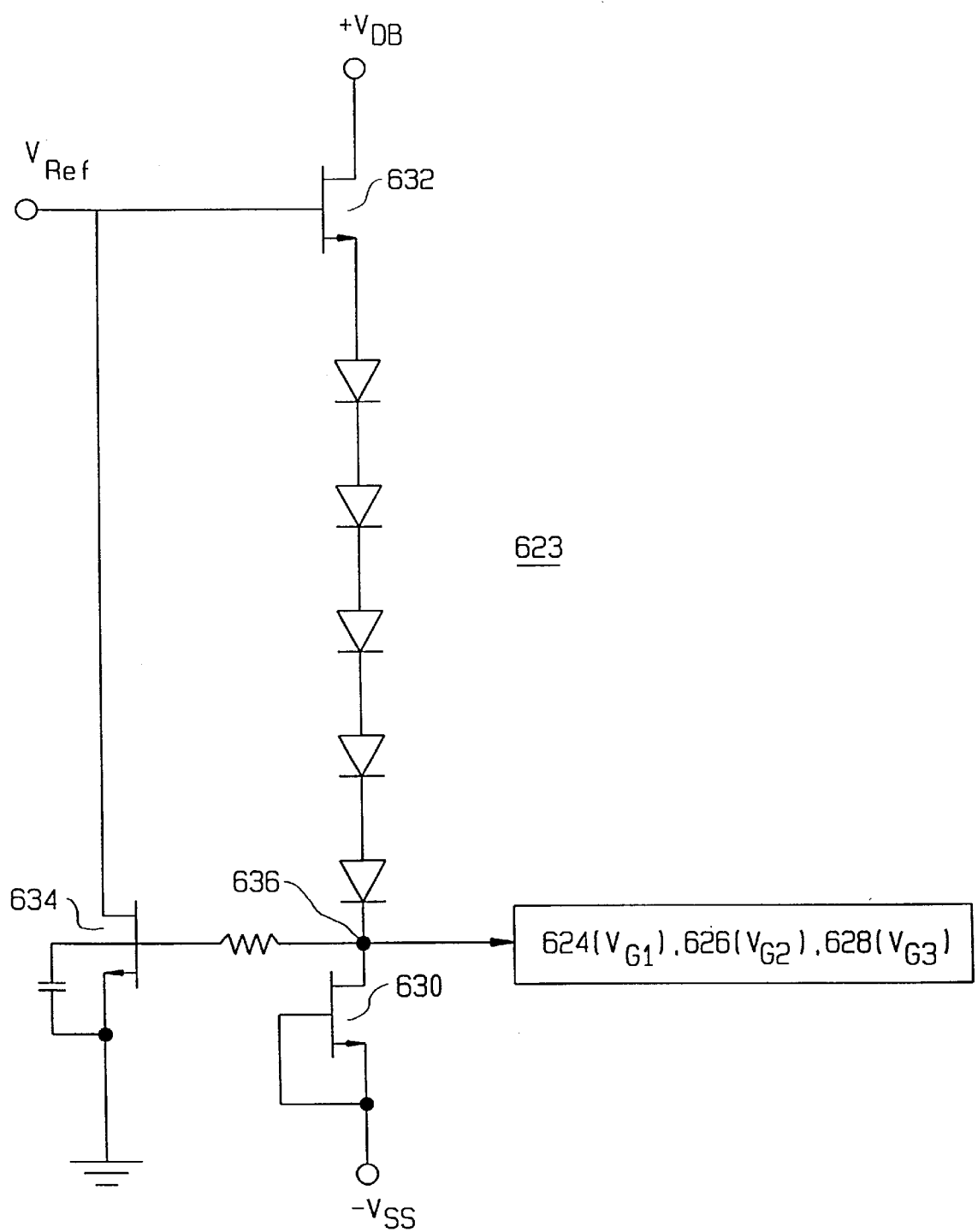
FIG. 11 is the schematic circuit diagram of a preferred embodiment of a bias control circuit of the present invention.
Figure 12:
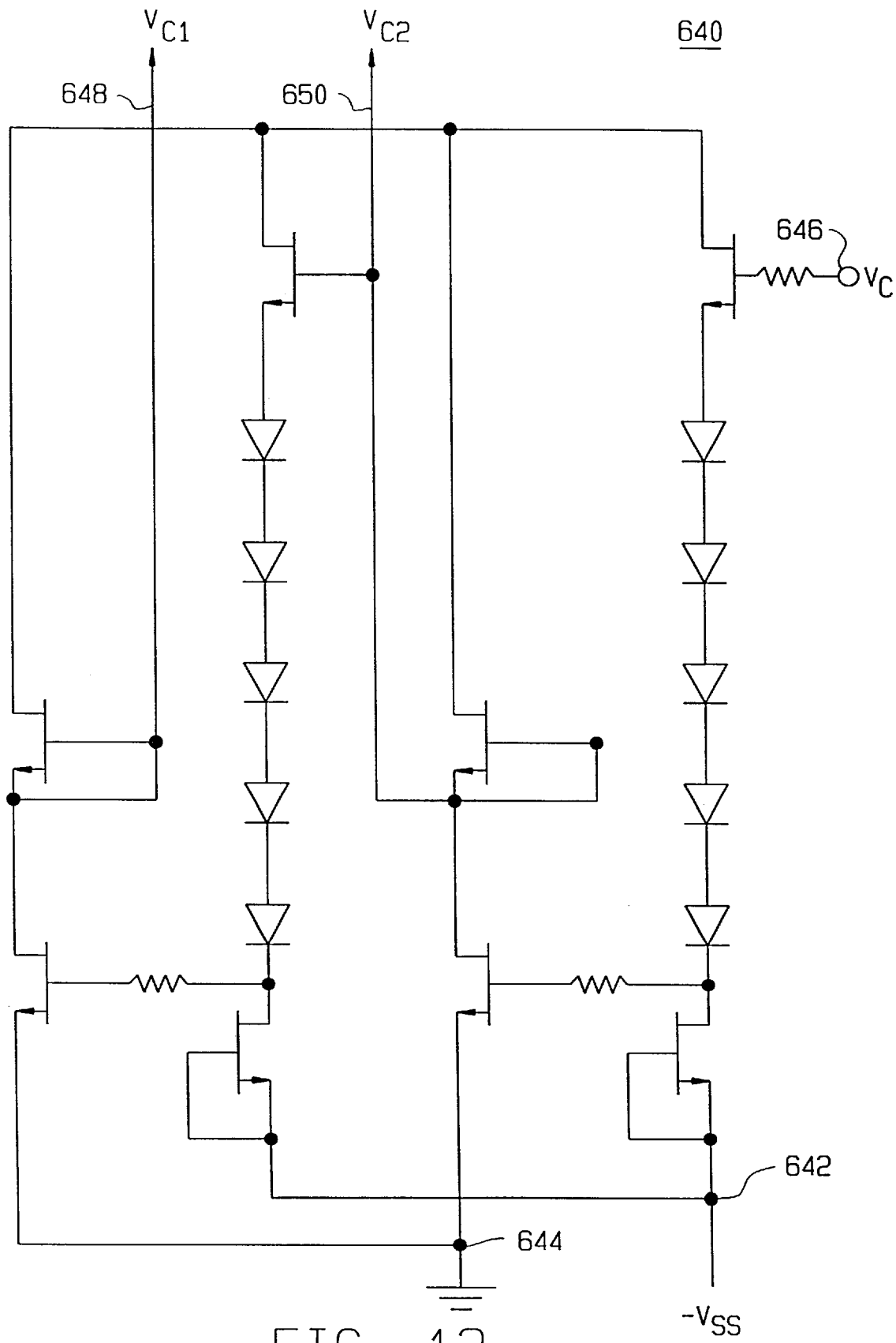
FIG. 12 is the schematic circuit diagram of a preferred embodiment of a control circuit of the present invention.

FIG. 10 is a partial schematic circuit diagram of a preferred GaAs MMIC circuit 302 of FIG. 8., excluding control circuit 350 and bias control circuit 352. (The schematic circuit diagram for the preferred bias control circuit is shown in FIG. 11, and the schematic circuit diagram for the preferred control circuit is shown in FIG. 12.) This preferred GaAs MMIC includes three amplifying stages: a first stage including a depletion-mode GaAs power FET 600, a second stage including a depletion-mode GaAs power FET 602, and a third stage including two depletion-mode GaAs FETs 604 and 606 connected in parallel. Two input signals, 800 MHz signal and 1900 MHz signal, are provided at terminals 608 and 610, respectively. Two depletion-mode GaAs FETs 612 and 614, controlled by a control circuit (shown in FIG. 12), function to selectively provide either the 800 MHz signal or the 1900 MHz signal to the first amplifying stage. The control circuit applies appropriate control voltages $V_{C1}$ and $V_{C2}$ through conductors 616 and 618 to the gate of FETs 612 and 614 to cause the FETs to turn on or off. The control circuit also control FETs 620 and 622 which function as switches for providing predetermined inter-stage impedance.

GaAs power FETs 600, 602, and 604 and 606 are biased by a bias control circuit (shown in FIG. 11) at terminals 624, 626 and 628. Bias voltages applied to the three terminals are designated as $V_{G1}$, $V_{G2}$ and $V_{G3}$.

By example and not limitation, FIG. 11 is a schematic circuit diagram of a preferred bias control circuit 623. Bias control circuit 623 comprises three depletion mode GaAs FETs 630, 632 and 634. A positive dc power source $+V_{DB}$ and a negative power source $-V_{SS}$ are connected to the bias control circuit. A reference voltage $V_{Ref}$ is also applied to the gate of FET 632. Bias circuit 623 provides a bias voltage at a terminal 636 that is connected to the amplifying circuit of FIG. 10 at terminals 624 ($V_{G1}$), 626 ($V_{G2}$) and 628 ($V_{G3}$). The amplitude of the bias voltage generated at terminal 636 is controlled by the reference voltage $V_{Ref}$ and it is between the positive power supply voltage $+V_{DB}$ and the negative power supply voltage $-V_{SS}$. By applying appropriate reference voltage $V_{Ref}$, a desired bias voltage is obtained. Preferably, bias control circuit 623 is a part of a GaAs MMIC which includes the amplifying circuit of FIG. 10 and the bias control circuit of FIG. 11. It will be apparent to one of ordinary skill in the art that other bias circuits different from the one depicted in FIG. 11, can also be used in place of bias control circuit 623 described above.

Referring to FIG. 12, by way of example and not limitation, a control circuit 640 is connected to ground at a terminal 644 and to a negative power source $-V_{SS}$ at a terminal 642. An external control voltage $V_C$ is provided to the control circuit at a terminal 646. Control voltages $V_{C1}$ and $V_{C2}$ are provided at terminals 648 and 650, respectively. Preferably, control circuit 640 is formed with amplifying circuit 302 depicted in FIG. 10 and bias control circuit 623 depicted in FIG. 11 as a GaAs MMIC.

Referring to both FIG. 10 and FIG. 12, control circuit 640 operates as follows: When $V_C$ is a low voltage such as ground, $V_{C1}$ is low and $V_{C2}$ is high and as a result, amplifying circuit 302 is set up for the 800 MHz operation. Conversely, if $V_C$ is high, then $V_{C1}$ becomes high and $V_{C2}$ is low; amplifying circuit 302 is ready for the 1900 MHz operation.

It will be apparent to one of ordinary skill in the art that other circuits different from the control circuit depicted and described herein may also be used in place of the control circuit, as long as they provide appropriate control voltages.

Figure 13:
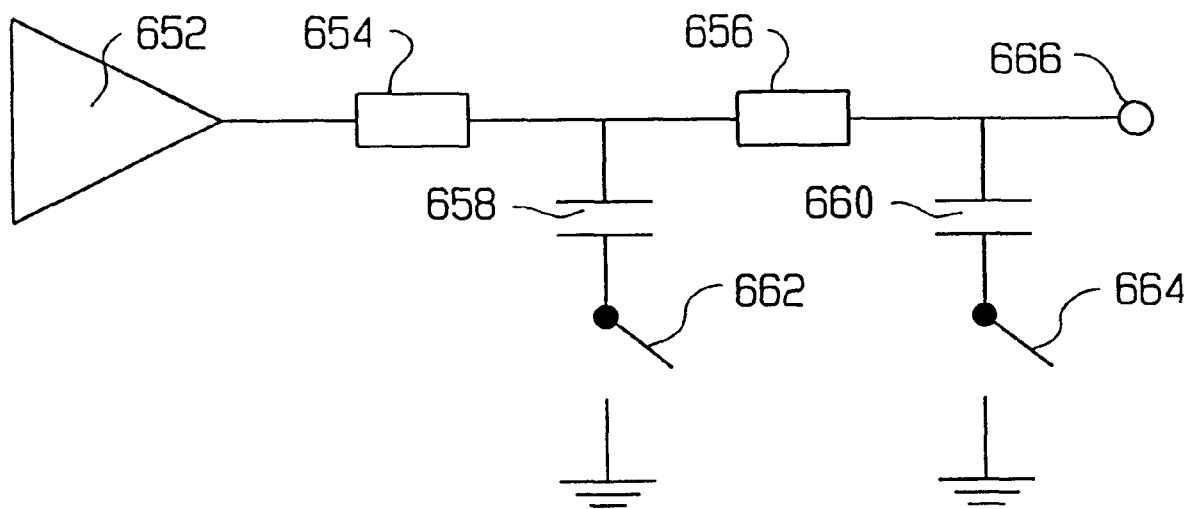
FIG. 13 is a block diagram showing an alternative way to provide predetermined output impedance in accordance with the present invention.

FIG. 13 illustrates an alternative way for providing predetermined output impedance for different frequency operations. For simplicity, only the last stage is illustrated. Last stage 652 is connected to two impedance networks 654 and 656. Capacitors 658 and 660 are coupled to ground through two switches 662 and 664, respectively. The apparatus of FIG. 13 operates as follows: for the 1900 MHz operation, switch 662 is closed and switch 664 is open; impedance networks 654 and 656 and capacitor 658 operate in conjunction with stage 652 to provide predetermined, desired output impedance for the 1900 MHz operation. For 800 MHz operation, switch 662 is open and switch 664 is closed, and the two impedance networks and capacitor 664 operate in conjunction with stage 652 to provide predetermined, desired output impedance for the 800 MHz operation.

As will be apparent to those skilled in the art, numerous modifications may be made within the scope of the invention, which is not intended to be limited except in accordance with the following claims.

What is claimed is:

1. A multi-band amplifier circuit comprising:
   a plurality of amplifiers, each amplifier
      comprising at least one amplifying stage,
      being configurable to receive an input signal within a particular frequency band, and
      forming part of a monolithic integrated circuit;
   a plurality of impedance matching networks, each impedance matching network being coupled to a corresponding one of the plurality of amplifiers, and each impedance matching network providing a predetermined impedance within the frequency band for the corresponding amplifier, wherein at least a portion of each of the plurality of impedance matching networks also forms part of the monolithic integrated circuit; and
   a control circuit coupled to each of the plurality of amplifiers for selectively enabling one of the amplifiers and disabling the remaining amplifiers in response to at least one control signal.

2. The multi-band amplifier circuit of claim 1 wherein each of the plurality of impedance matching networks also forms part of the monolithic integrated circuit.

3. The multi-band amplifier circuit of claim 1 wherein the control circuit also forms part of the monolithic integrated circuit.

4. The multi-band amplifier circuit of claim 1 wherein each impedance matching network is coupled to an input of the corresponding amplifier to provide a predetermined input impedance within the frequency band for the corresponding amplifier.

5. The multi-band amplifier circuit of claim 4 wherein each predetermined input impedance approximately matches a source impedance for the input signal of the corresponding amplifier.

6. The multi-band amplifier circuit of claim 1 wherein each impedance matching network is coupled to an output of the corresponding amplifier to provide a predetermined output impedance within the frequency band for the corresponding amplifier.

7. The multi-band amplifier circuit of claim 1 wherein each amplifier comprises a plurality of amplifying stages arranged as a cascade, and wherein each amplifier further comprises at least one interstage impedance matching network coupled between two successive amplifying stages, wherein each interstage impedance matching network provides a predetermined interstage impedance within the frequency band for the corresponding amplifier.

8. The multi-band amplifier circuit of claim 7 wherein the interstage impedance is such that an output impedance of one of the successive amplifying stages approximately matches the input impedance of the other of the successive amplifying stages within the frequency band for the corresponding amplifier.

9. The multi-band amplifier circuit of claim 1 wherein the frequency band for one amplifier is near 800 MHz and the frequency band for another amplifier is near 1900 MHz.

10. The multi-band amplifier circuit of claim 1 wherein, when enabling one of the amplifiers, the control circuit further provides a predetermined bias to bias the enabled amplifier in a desired mode of operation.

11. The multi-band amplifier circuit of claim 10 wherein the desired mode of amplifier operation is one of: class A, B, AB, or C operation.

12. A multi-band amplifier circuit comprising:
   a plurality of amplifiers, each amplifier
      comprising an input, an output, and at least one amplifying stage,
      being configurable to receive an input signal within a particular frequency band, and
      forming part of a monolithic integrated circuit;
   a plurality of input impedance networks, each input impedance network being coupled to the input of a corresponding one of the plurality of amplifiers, and each input impedance network providing a predetermined input impedance within the frequency band for the corresponding amplifier, wherein at least a portion of each of the plurality of input impedance networks also forms part of the monolithic integrated circuit;

a plurality of output impedance networks, each output impedance network being coupled to the output of a corresponding one of the plurality of amplifiers, and each output impedance network providing a predetermined output impedance within the frequency band for the corresponding amplifier; and a control circuit coupled to each of the plurality of amplifiers for selectively enabling one of the amplifiers and disabling the remaining amplifiers in response to at least one control signal.

13. The multi-band amplifier circuit of claim 12 wherein each of the plurality of input impedance networks also forms part of the monolithic integrated circuit.

14. The multi-band amplifier circuit of claim 13 wherein each of the plurality of output impedance networks also forms part of the monolithic integrated circuit.

15. The multi-band amplifier circuit of claim 14 wherein the control circuit also forms part of the monolithic integrated circuit.

16. The multi-band amplifier circuit of claim 12 wherein each predetermined input impedance approximately matches a source impedance for an input signal of the corresponding amplifier.

17. A multi-band amplifier circuit comprising:

a plurality of GaAs amplifiers, each GaAs amplifier
comprising at least one amplifying stage having at least one GaAs transistor,
being configurable to receive an input signal within a particular frequency band, and
forming part of a GaAs monolithic integrated circuit;

a plurality of impedance matching networks, each impedance matching network being coupled to a corresponding one of the plurality of amplifiers, and each impedance matching network providing a predetermined impedance within the frequency band for the corresponding amplifier, wherein at least a portion of each of the plurality of impedance matching networks also forms part of the GaAs monolithic integrated circuit; and a control circuit coupled to each of the plurality of amplifiers for selectively enabling one of the amplifiers and disabling the remaining amplifiers in response to at least one control signal.

18. The multi-band amplifier circuit of claim 17 wherein each of the plurality of impedance matching networks also forms part of the GaAs monolithic integrated circuit.

19. The multi-band amplifier circuit of claim 17 wherein the control circuit also forms part of the GaAs monolithic integrated circuit.

20. The multi-band amplifier circuit of claim 17 wherein each impedance matching network is coupled to an input of the corresponding GaAs amplifier to provide a predetermined input impedance within the frequency band for the corresponding GaAs amplifier.

21. The multi-band amplifier circuit of claim 20 wherein each predetermined input impedance approximately matches a source impedance for the input signal of the corresponding GaAs amplifier.

22. The multi-band amplifier circuit of claim 17 wherein each impedance matching network is coupled to an output of the corresponding GaAs amplifier and provides a predetermined output impedance within the frequency band for the corresponding GaAs amplifier.

23. The multi-band amplifier circuit of claim 17 wherein each GaAs amplifier comprises a plurality of amplifying stages arranged as a cascade, and wherein each GaAs amplifier further comprises at least one interstage impedance matching network coupled between two successive amplifying stages, each interstage impedance matching network providing a predetermined interstage impedance within the frequency band for the corresponding GaAs amplifier.

24. The multi-band amplifier circuit of claim 23 wherein the interstage impedance is such that an output impedance of one of the successive amplifying stages approximately matches an input impedance of the other of the successive amplifying stages within the frequency band for the corresponding GaAs amplifier.

25. The multi-band amplifier circuit of claim 17 wherein the frequency band for one amplifier is at near 800 MHz and the frequency band for another amplifier is near 1900 MHz.

26. The multi-band amplifier circuit of claim 17 wherein, when enabling one of the GaAs amplifiers, the control circuit further provides a predetermined bias to bias the enabled GaAs amplifier in a desired mode of operation.

27. The multi-band amplifier circuit of claim 26 herein the desired mode of amplifier operation is one of: class A, B, AB, or C operation.

28. The multi-band amplifier circuit of claim 17 wherein, in each amplifying stage of each GaAs amplifier, each GaAs transistor is a GaAs field effect transistor.

29. A wireless communication device including a dual-band amplifier circuit, the dual-band amplifier circuit comprising:

a first amplifier
comprising at least one amplifying stage,
being configurable to receive an input signal within a first wireless communication frequency band, and
forming part of a monolithic integrated circuit within the device;

a first input impedance matching network coupled to the first amplifier, the first impedance matching network being configured to provide a predetermined impedance within the first frequency band;

a second amplifier
comprising at least one amplifying stage,
being configurable to receive an input signal within a second wireless communication frequency band, and
forming part of the monolithic integrated circuit;

a second input impedance matching network coupled to the second amplifier, the second impedance matching network providing a predetermined impedance within the second frequency band, wherein the first and second impedance matching networks also form part of the monolithic integrated circuit; and a control circuit coupled to each of the plurality of amplifiers for selectively enabling one amplifier and disabling the other amplifier in response to at least one control signal.

30. An amplifier circuit comprising:

an amplifier having at least one amplifying stage, the amplifier receiving an input signal in one of a plurality of frequency bands;

a plurality of impedance matching networks each comprising at least one component, each impedance matching network corresponding to one of the plurality of frequency bands and providing a predetermined impedance within the corresponding frequency band, wherein the plurality of impedance matching networks includes a first impedance matching network and a second impedance matching network, and the first and second networks each include a common passive component, and wherein furthermore the first impedance matching network comprises a first passive component and a second passive component, the second impedance matching network comprises the first passive component, and the second passive component is bypassed by the switch when the switch couples the second impedance matching network to the amplifier; and a switch for selectively coupling a particular one of the plurality of impedance matching networks to the amplifier in response to at least one control signal.

31. The amplifier circuit of claim 30 wherein none of the plurality of impedance matching networks include a passive component in common with the other networks.

32. The amplifier circuit of claim 30 wherein each impedance matching network is selectively coupled to an input of the amplifier to provide a predetermined input impedance for the amplifier within the corresponding frequency band.

33. The amplifier circuit of claim 32 wherein each predetermined input impedance approximately matches a source impedance for the input signal of the amplifier when the input signal is in the corresponding frequency band.

34. The amplifier circuit of claim 30 wherein each impedance matching network is selectively coupled to an output of the amplifier to provide a predetermined output impedance for the amplifier within the corresponding frequency band.

35. The amplifier circuit of claim 30 each impedance matching network is selectively coupled to a power input of the amplifier to provide a predetermined output impedance for the amplifier within the corresponding frequency band.

36. The amplifier circuit of claim 30 wherein one frequency band is near 800 MHz and another frequency band is near 1900 MHz.

37. The amplifier circuit of claim 30 further comprising a bias control circuit for providing, in response to the frequency band of the input signal, a desired bias to the amplifier to bias the amplifier in a desired mode of amplifier operation.

38. The amplifier circuit of claim 37 wherein the desired mode of amplifier operation is one of: class A, B, AB, or C operation.

39. The amplifier circuit of claim 30 wherein each impedance matching network comprises at least one reactive component.

* * * * *